(12) United States Patent
Lichtenwalner

(10) Patent No.: US 11,563,080 B2
(45) Date of Patent: Jan. 24, 2023

(54) TRENCHED POWER DEVICE WITH SEGMENTED TRENCH AND SHIELDING

(71) Applicant: Wolfspeed, Inc., Durham, NC (US)

(72) Inventor: Daniel Jenner Lichtenwalner, Raleigh, NC (US)

(73) Assignee: Wolfspeed, Inc., Durham, NC (US)

(*) Notice: Subject to any disclaimer, the term of this patent is extended or adjusted under 35 U.S.C. 154(b) by 203 days.

(21) Appl. No.: 16/863,399

(22) Filed: Apr. 30, 2020

(65) Prior Publication Data
US 2021/0343834 A1 Nov. 4, 2021

(51) Int. Cl.
*H01L 29/78* (2006.01)
*H01L 29/10* (2006.01)
*H01L 29/06* (2006.01)
*H01L 21/04* (2006.01)
*H01L 29/16* (2006.01)
*H01L 29/66* (2006.01)

(52) U.S. Cl.
CPC .......... *H01L 29/063* (2013.01); *H01L 21/046* (2013.01); *H01L 29/1095* (2013.01); *H01L 29/1608* (2013.01); *H01L 29/66068* (2013.01); *H01L 29/7813* (2013.01)

(58) Field of Classification Search
CPC ....... H01L 29/06; H01L 29/063; H01L 29/10; H01L 29/1095; H01L 29/16; H01L 29/1608; H01L 29/66; H01L 29/66068; H01L 29/78; H01L 29/7813; H01L 21/04; H01L 21/046
USPC .......................................................... 257/77
See application file for complete search history.

(56) References Cited

U.S. PATENT DOCUMENTS

| | | |
|---|---|---|
| 6,194,741 B1 | 2/2001 | Kinzer et al. |
| 9,887,287 B1* | 2/2018 | Lichtenwalner ............ H01L 29/66734 |
| 2016/0104797 A1* | 4/2016 | Poelzl .................. H01L 29/404 257/331 |
| 2018/0277637 A1* | 9/2018 | Meiser ................ H01L 29/7804 |

FOREIGN PATENT DOCUMENTS

| | | |
|---|---|---|
| EP | 1994566 A1 | 11/2008 |
| EP | 2863417 A1 | 4/2015 |

OTHER PUBLICATIONS

Notification of Transmittal of the International Search Report and the Written Opinion of the International Searching Authority, or the Declaration, in corresponding PCT Application No. PCT/US2021/029306 (dated Jul. 26, 2021).

* cited by examiner

*Primary Examiner* — Fazli Erdem
(74) *Attorney, Agent, or Firm* — Myers Bigel, P.A.

(57) ABSTRACT

A semiconductor device includes a semiconductor layer structure of a wide band-gap semiconductor material. The semiconductor layer structure includes a drift region having a first conductivity type and a well region having a second conductivity type. A plurality of segmented gate trenches extend in a first direction in the semiconductor layer structure. The segmented gate trenches include respective gate trench segments that are spaced apart from each other in the first direction with intervening regions of the semiconductor layer structure therebetween. Related devices and fabrication methods are also discussed.

27 Claims, 16 Drawing Sheets

TRENCHED POWER DEVICE WITH SEGMENTED TRENCH AND SHIELDING

FIELD

The present invention relates to power semiconductor devices and, more particularly, to power semiconductor devices having gate trenches and methods of fabricating such devices.

BACKGROUND

Power semiconductor devices are used to carry large currents and support high voltages. A wide variety of power semiconductor devices may be used in the art, including, for example, power Metal Oxide Semiconductor Field Effect Transistors ("MOSFET"), bipolar junction transistors ("BJTs"), Insulated Gate Bipolar Transistors ("IGBT"), Junction Barrier Schottky diodes, Gate Turn-Off Transistors ("GTO"), MOS-controlled thyristors and various other devices. These power semiconductor devices are generally fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than about 1.40 eV, for example, greater than about 2 eV.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, such as semiconductor substrates and/or semiconductor epitaxial layers.

A conventional power semiconductor device typically has a semiconductor substrate, such as a silicon carbide substrate, having a first conductivity type (e.g., an n-type substrate) on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" structures that are disposed in parallel to each other and that together can function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complex manufacturing process.

SUMMARY

According to some embodiments of the present disclosure, a semiconductor device includes a semiconductor layer structure comprising a wide band-gap semiconductor material, and a plurality of segmented gate trenches extending in a first direction in the semiconductor layer structure. The semiconductor layer structure includes a drift region having a first conductivity type and a well region having a second conductivity type. The segmented gate trenches include respective gate trench segments that are spaced apart from each other in the first direction with intervening regions of the semiconductor layer structure therebetween.

In some embodiments, the semiconductor device may further include a plurality of shielding patterns having the second conductivity type extending in the first direction underneath the respective gate trench segments and in the intervening regions therebetween.

In some embodiments, the semiconductor device may further include respective shielding connection patterns having the second conductivity type on the shielding patterns in the intervening regions between the respective gate trench segments. The respective shielding connection patterns may extend in a second direction that is different than the first direction.

In some embodiments, the respective shielding connection patterns may be in an upper portion of the semiconductor layer structure. Respective source contacts may be provided on the respective shielding connection patterns, and the respective shielding connection patterns may electrically connect the respective source contacts to the shielding patterns.

In some embodiments, the respective gate trench segments of at least two of the segmented gate trenches may be aligned along the second direction, and the respective shielding connection patterns may continuously extend in the second direction.

In some embodiments, the respective gate trench segments of at least two of the segmented gate trenches may be offset along the second direction, and the respective shielding connection patterns may discontinuously extend in the second direction.

In some embodiments, the respective gate trench segments may include opposing sidewalls that extend in the first direction. The opposing sidewalls may define respective semiconductor channel regions having the first conductivity type.

In some embodiments, respective portions of the opposing sidewalls may be free of the shielding patterns thereon.

In some embodiments, the respective gate trench segments may include respective gate electrodes therein. Respective gate electrode connectors may be provided on the respective gate electrodes and may extend in the second direction between the respective shielding connection patterns.

According to some embodiments of the present disclosure, a semiconductor device includes a semiconductor layer structure comprising a wide band-gap semiconductor material. The semiconductor layer structure includes a drift region having a first conductivity type and a well region having a second conductivity type. A plurality of gate trenches extend in a first direction in the semiconductor layer structure. The gate trenches respectively include opposing sidewalls and a floor therebetween that extend in the first direction. A plurality of shielding patterns having the second conductivity type extend in the first direction underneath the floors of the gate trenches. The opposing sidewalls define respective semiconductor channel regions having the first conductivity type.

In some embodiments, respective portions of the opposing sidewalls may be free of the shielding patterns thereon.

In some embodiments, the gate trenches may be segmented gate trenches comprising respective gate trench segments that are spaced apart from each other in the first direction with intervening regions of the semiconductor layer structure therebetween, and the shielding patterns may extend into the intervening regions.

In some embodiments, respective shielding connection patterns having the second conductivity type may be provided on the shielding patterns in the intervening regions between the respective gate trench segments. The respective shielding connection patterns may extend in a second direction that is different than the first direction.

In some embodiments, the respective shielding connection patterns may be in an upper portion of the semiconductor layer structure. Respective source contacts may be provided on the respective shielding connection patterns in the upper portion of the semiconductor layer structure. The respective shielding connection patterns may electrically connect the respective source contacts to the shielding patterns. A drain contact may be provided on a lower portion of the semiconductor layer structure opposite the upper portion.

In some embodiments, the gate trenches that respectively comprise the opposing sidewalls may be immediately adjacent one another.

According to some embodiments of the present disclosure, a semiconductor device, includes a semiconductor layer structure comprising a wide band-gap semiconductor material. The semiconductor layer structure includes a drift region having a first conductivity type and a well region having a second conductivity type. A plurality of gate trenches extend in a first direction in the semiconductor layer structure. The gate trenches respectively include opposing sidewalls defining respective semiconductor channel regions. A collective conducting area of the respective semiconductor channel regions defined by the opposing sidewalls of the gate trenches is greater than half of a total sidewall area of the plurality of gate trenches.

In some embodiments, a plurality of shielding patterns having the second conductivity type may extend in the first direction underneath the gate trenches. The gate trenches that respectively comprise the opposing sidewalls may be immediately adjacent one another.

In some embodiments, the gate trenches may be segmented gate trenches comprising respective gate trench segments that are spaced apart from each other in the first direction with intervening regions of the semiconductor layer structure therebetween, and the shielding patterns may extend into the intervening regions.

In some embodiments, respective portions of the opposing sidewalls may be free of the shielding patterns thereon.

In some embodiments, respective shielding connection patterns having the second conductivity type may be provided on the shielding patterns in the intervening regions between the respective gate trench segments. The respective shielding connection patterns may extend in a second direction that is different than the first direction.

In some embodiments, the respective shielding connection patterns may be in an upper portion of the semiconductor layer structure. Respective source contacts may be provided on the respective shielding connection patterns in the upper portion of the semiconductor layer structure. The respective shielding connection patterns may electrically connect the respective source contacts to the shielding patterns. A drain contact may be provided on a lower portion of the semiconductor layer structure opposite the upper portion.

According to some embodiments of the present disclosure, a method of fabricating a semiconductor device includes providing a semiconductor layer structure comprising a wide band-gap semiconductor material, where the semiconductor layer structure includes a drift region having a first conductivity type and a well region having a second conductivity type. The method further includes forming a plurality of segmented gate trenches extending in a first direction in the semiconductor layer structure, the segmented gate trenches comprising respective gate trench segments that are spaced apart from each other in the first direction with intervening regions of the semiconductor layer structure therebetween.

In some embodiments, a plurality of shielding patterns having the second conductivity type may be formed extending in the first direction underneath the respective gate trench segments and in the intervening regions therebetween.

In some embodiments, respective shielding connection patterns having the second conductivity type may be formed on the shielding patterns in the intervening regions between the respective gate trench segments. The respective shielding connection patterns may extend in a second direction that is different than the first direction.

In some embodiments, the respective gate trench segments may include opposing sidewalls defining respective semiconductor channel regions having the first conductivity type, and the plurality of shielding patterns may be formed such that respective portions of the opposing sidewalls are free of the shielding patterns thereon.

In some embodiments, forming the plurality of shielding patterns and the respective shielding connection patterns may include performing a first implantation process to implant a first concentration of dopants of the second conductivity type into the respective gate trench segments and in the intervening regions therebetween to form the plurality of shielding patterns, and performing a second implantation process to implant a second concentration of dopants of the second conductivity type into the intervening regions between the respective gate trench segments at an upper portion of the semiconductor layer structure to form the respective shielding connection patterns.

In some embodiments, respective source contacts may be formed on portions of the respective shielding connection patterns between the segmented gate trenches. The respective shielding connection patterns may electrically connect the respective source contacts to the shielding patterns.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 7A, 7C, 7E, and 7G are cross-sectional views along a direction parallel to extension direction of the segmented trenches, while FIGS. 7B, 7D, 7F, and 7H are cross-sectional views along a direction perpendicular to the extension direction of the segmented trenches.

FIGS. 8A, 8C, 8E, and 8G are cross-sectional views along a direction parallel to the extension direction of the segmented trenches, while FIGS. 8B, 8D, 8F, and 8H are cross-sectional views along a direction perpendicular to the extension direction of the segmented trenches.

DETAILED DESCRIPTION

Some embodiments of the present disclosure may arise from recognition of limitations of some existing gate trench power semiconductor devices. For example, vertical power semiconductor devices that include gate trenches, also referred to as trenched vertical power devices, may also include regions having a first (n- or p-) conductivity type within layers having a second (p- or n-) conductivity type at deep levels within the device such as, for example, 1-5 microns or more from the upper surface of the device. In particular, it may be desirable to form deep or 'buried' shielding semiconductor regions, also referred to as shielding patterns, of a different conductivity type than the layer(s) of the semiconductor material underneath the well regions and/or gate electrodes of the device. However, such shielding patterns (e.g., deep buried p-type or n-type regions) can limit the active area of the device.

Forming such shielding patterns may pose challenges when trenched vertical power devices are fabricated in silicon carbide or other wide band-gap semiconductor materials. Methods for doping a semiconductor material with n-type and/or p-type dopants include (1) doping the semiconductor material during the growth thereof, (2) diffusing the dopants into the semiconductor material, and (3) using ion implantation to selectively implant the dopants in the semiconductor material. When silicon carbide is doped during epitaxial growth, the dopants tend to unevenly accumulate, and hence the dopant concentration may vary by, for example, by +15%, which can negatively affect device operation and/or reliability. Additionally, doping by diffusion is not an option in silicon carbide, gallium nitride and various wide band-gap semiconductor devices since n-type and p-type dopants tend to not diffuse well (or at all) in there materials, even at high temperatures.

Figure 1:
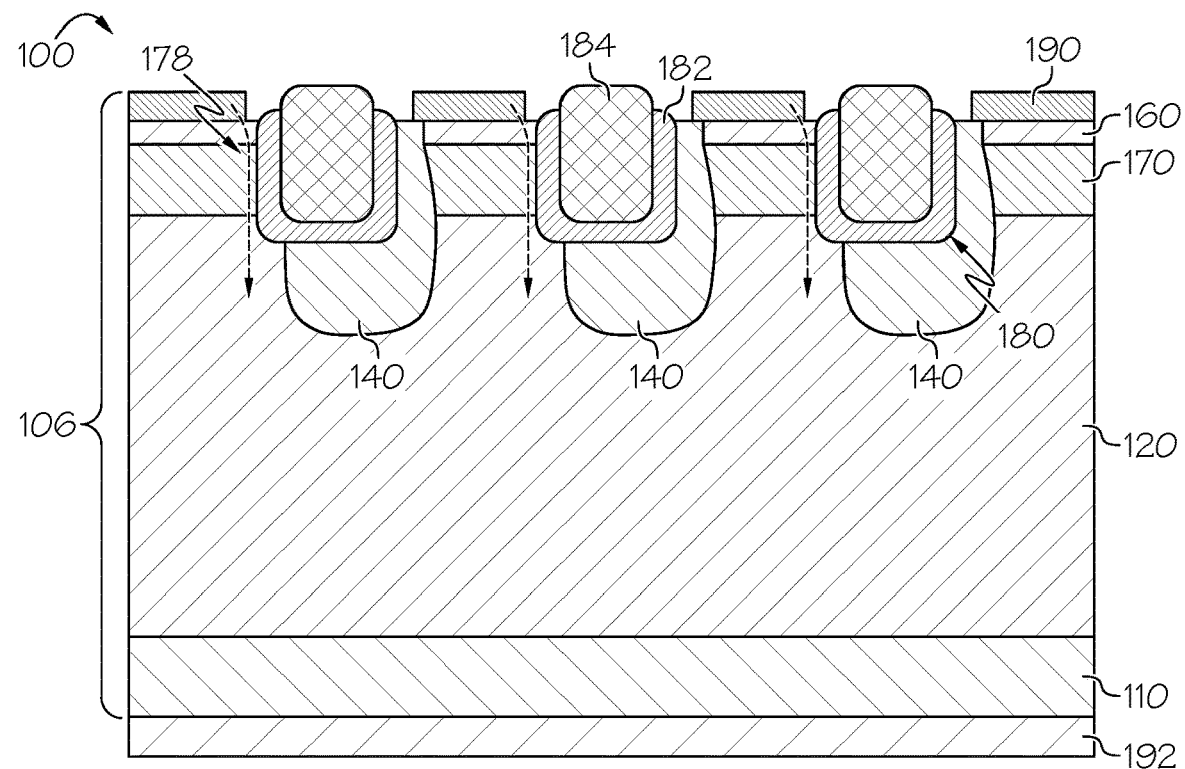
FIG. 1 is a cross-sectional view illustrating an example of a gate trench power semiconductor device including a shielding region blocking one side of the trench.
Figure 2:
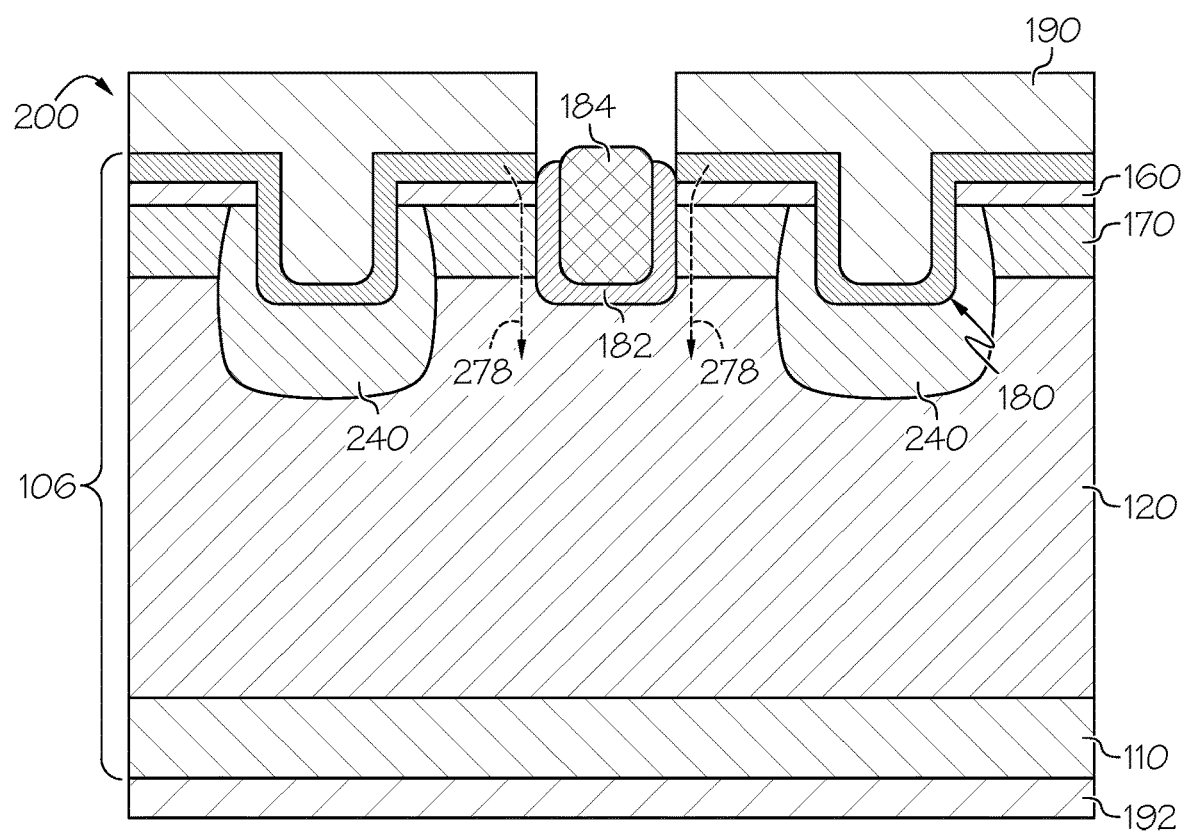
FIG. 2 is a cross-sectional view illustrating an example of a gate trench power semiconductor device including alternating shielding regions and gate trench regions.

Various approaches have been used previously to form shielding patterns in trenched vertical power semiconductor devices. FIGS. 1 and 2 schematically illustrate two examples of such different approaches. Although described and illustrated herein with reference to regions of specific conductivity types (i.e., n-type and p-type) by way of example, it will be understood that the conductivity types of the regions may be reversed (i.e., p-type and n-type) in accordance with embodiments of the present disclosure.

FIGS. 1 and 2 are cross-sectional views illustrating examples of trenched vertical power devices (illustrated as power MOSFETs 100, 200) including deep buried P-type semiconductor regions 140, 240. As shown in FIGS. 1 and 2, the power MOSFETs 100, 200 each include a heavily-doped (n+) n-type substrate 110, e.g., a silicon carbide substrate. A lightly-doped (n−) drift layer or region 120 is provided on the substrate 110. In some embodiments, an upper portion of the n-type drift region 120 may include an n-type current spreading layer ("CSL"). A moderately-doped p-type layer is formed (for example, by epitaxial growth or implantation) on the drift region 120 and acts as the p-type well regions (or "p-wells") 170 for the device 100. The substrate 110, drift region 120 (including current spreading layer) and the moderately doped p-type layer defining the p-wells 170, along with the various regions/patterns formed therein, are included in a semiconductor layer structure 106 of the MOSFETs 100, 200.

Still referring to FIGS. 1 and 2, trenches 180 are formed in the semiconductor layer structure 106 with 'striped' gate trench layouts, in which the trenches 180 continuously extend in parallel to one another in a longitudinal direction. The trenches 180 (in which the gates electrodes 184 are formed) extend through the moderately-doped p-type layer 170 to define the p-wells. Heavily-doped (pc) p-type shielding patterns 140, 240 are formed in the drift region 120, for example, by ion implantation into portions exposed by the trenches 180. The deep shielding patterns 140, 240 may be in electrical connection with the p-wells 170, on which the source contacts 190 are formed. A gate insulating layer 182 is formed on the bottom surface and sidewalls of each trench 180 (in FIG. 1) or in alternating ones of the trenches 180 (in FIG. 2, with source contacts 190 formed in the intervening trenches 180).

A gate electrode 184 (or "gate") is formed on each gate insulating layer 182 to fill the respective gate trenches 180. Vertical transistor channel regions (with conduction shown by dashed arrows) are defined in the p-wells 172 adjacent the gate insulating layer 182. Heavily-doped n+ source regions 160 are formed in upper portions of the p-wells 170, for example, via ion implantation. Source contacts 190 are formed on the heavily-doped n-type source regions 160 and on the deep shielding patterns 140, 240. The source contacts 190 may be ohmic metal in some embodiments. A drain contact 192 is formed on the lower surface of the substrate 110. A gate contact (not shown) may be formed on each gate electrode 184.

In the examples of FIGS. 1 and 2, the deep buried p-type semiconductor regions or shielding patterns 140, 240 are configured to prevent degradation of the trench MOSFETs 100, 200 at high electric fields, but also limit the active conducting area of the devices 100, 200. In particular, in the devices 100 and 200, the deep buried p-type semiconductor regions 140, 240 at the bottom and at one side 178 (in FIG. 1) or at both sides 278 (in FIG. 2) of the gate trenches 180 are configured to provide the voltage and/or current blocking by connections to respective source contacts 190, which are connected to ground. In FIG. 1, the deep buried p-type semiconductor regions 140 are offset towards the source contacts 190 at one side of the trench 180. In FIG. 2, the deep buried p-type semiconductor regions 240 and the gates 184 are provided in alternating trenches 180. As such, in the devices 100 and 200, significant portions of the channel region may be dedicated to blocking, such that less than the entirety of the available channel area (e.g., less than half of the total trench sidewall area of the devices 100, 200) may be used for conduction.

Embodiments of the present disclosure are directed to trenched vertical power semiconductor devices including layouts and design arrangements in which the trenches are segmented into respective discontinuous trench portions (referred to herein as trench segments, each with opposing sidewalls and a floor or bottom surface therebetween) along the longitudinal direction in which the trenches extend (e.g., along parallel trench 'stripes'), which may address some limitations of conventional gate trench power device designs. The segmented trenches include intervening regions of the semiconductor layer structure between respective trench segments, deep shielding regions (referred to herein as shielding patterns) extending under the trench segments and into the intervening regions, and shielding connection patterns in the intervening regions (at the 'top' of the device, between trench segments) to provide electrical connection to the deep shielding patterns under and between the trench segments. The shielding connection patterns may allow the deep shielding patterns to be electrically grounded (e.g., by connection to source contacts provided on the connection patterns at the top of the device). Electrical contact to the deep-p or n-shielding patterns under the trenches can be formed more easily, so device fabrication can be simplified. The shielding patterns and/or shielding connection patterns may be implanted regions in some embodiments.

Figure 5A:
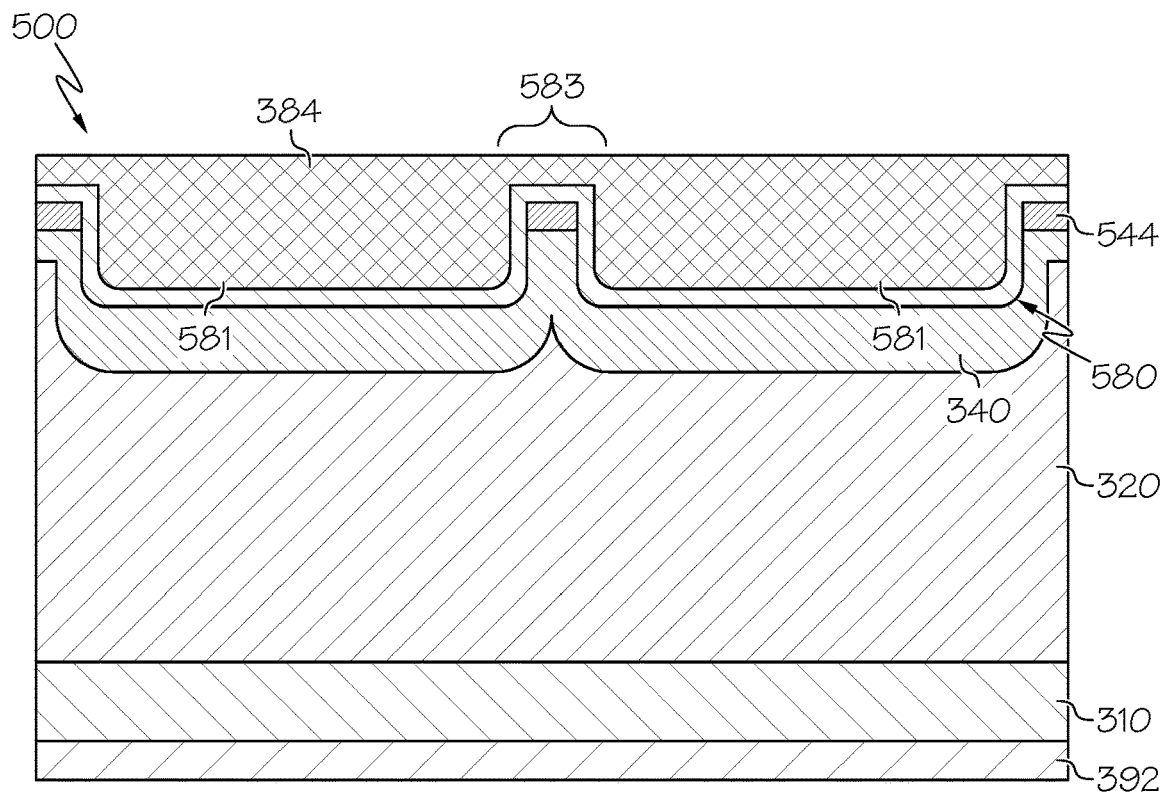
FIGS. 5A and 5B are cross-sectional views along parallel and perpendicular directions, respectively, relative to a direction of extension of segmented trenches in a gate trench power semiconductor device accordance with further embodiments of the present disclosure.

As such, trenched vertical power semiconductor devices including segmented trench configurations as described herein can provide improved electrical contact at the top of the device to the deep (p- or n-type) shielding regions that provide shielding under the trenches when the device is in the blocking mode. Conductive connections between gate electrodes (also referred to herein as gate electrode connectors) that extend in a different direction than (e.g., perpendicular to) the trenches may also be provided. In some embodiments, strict design control regarding the ratio of trench channel area (for conduction) to the shielding resistance may be implemented, so the device resistance and switching speed can be tailored to the application. For example, if the doping of the shielding patterns is high and the conductivity of the connection patterns is high, the length of the trench segments may be increased, with fewer connection patterns between segments (e.g., as shown in FIG. 5A). In some embodiments, the trench segments may vary in length, e.g., from about 3 microns to about 1000 microns; from about 25 microns to about 800 microns; from about 100 microns to about 500 microns; or from about 200 microns to about 400 microns. Likewise, the widths of the connection patterns may vary, e.g., from about 0.5 microns to about 50 microns; from about 1 micron to about 45 microns; from about 2 microns to about 25 microns; or from about 5 microns to about 15 microns.

As the connection patterns to the deep shielding patterns are provided in the intervening regions between trench segments along the longitudinal direction of the trenches, both opposing sidewalls of the trench segments may include portions that are free of the deep shielding patterns, and thus, both opposing sidewalls can be used for semiconductor channel regions and increased conducting area. The absence of shielding patterns along portions of the gate trench sidewalls may thereby increase current capability of devices described herein, without reduction in blocking performance or increase in on-resistance. In some embodiments, blocking performance or on-resistance may be improved by providing the deep shielding patterns at corners of the gate trenches in order to protect the corners of the gate insulating layer from high electric fields during reverse blocking operation, with the opposing trench sidewalls being free of the deep shielding regions or shielding patterns to increase the channel area. In some embodiments, the size (e.g., cross-sectional area) of the deep shielding patterns may be reduced and/or minimized, while increasing or maximizing the lengths of the trench segments (in the longitudinal direction).

Although described and illustrated herein with reference to shielding patterns, shielding connection patterns, and/or other semiconductor regions of specific conductivity types (i.e., n-type and p-type) by way of example, it will be understood that the conductivity types of the regions may be reversed (i.e., p-type and n-type) in accordance with any of the embodiments described herein. Also, while gate electrodes (including the gate material and gate insulating material) are illustrated as including extension regions that are outside of the gate trench segments, it will be understood that such extension regions may not be present and/or may be discontinuous outside of the trench segments in some embodiments.

Figure 3A:
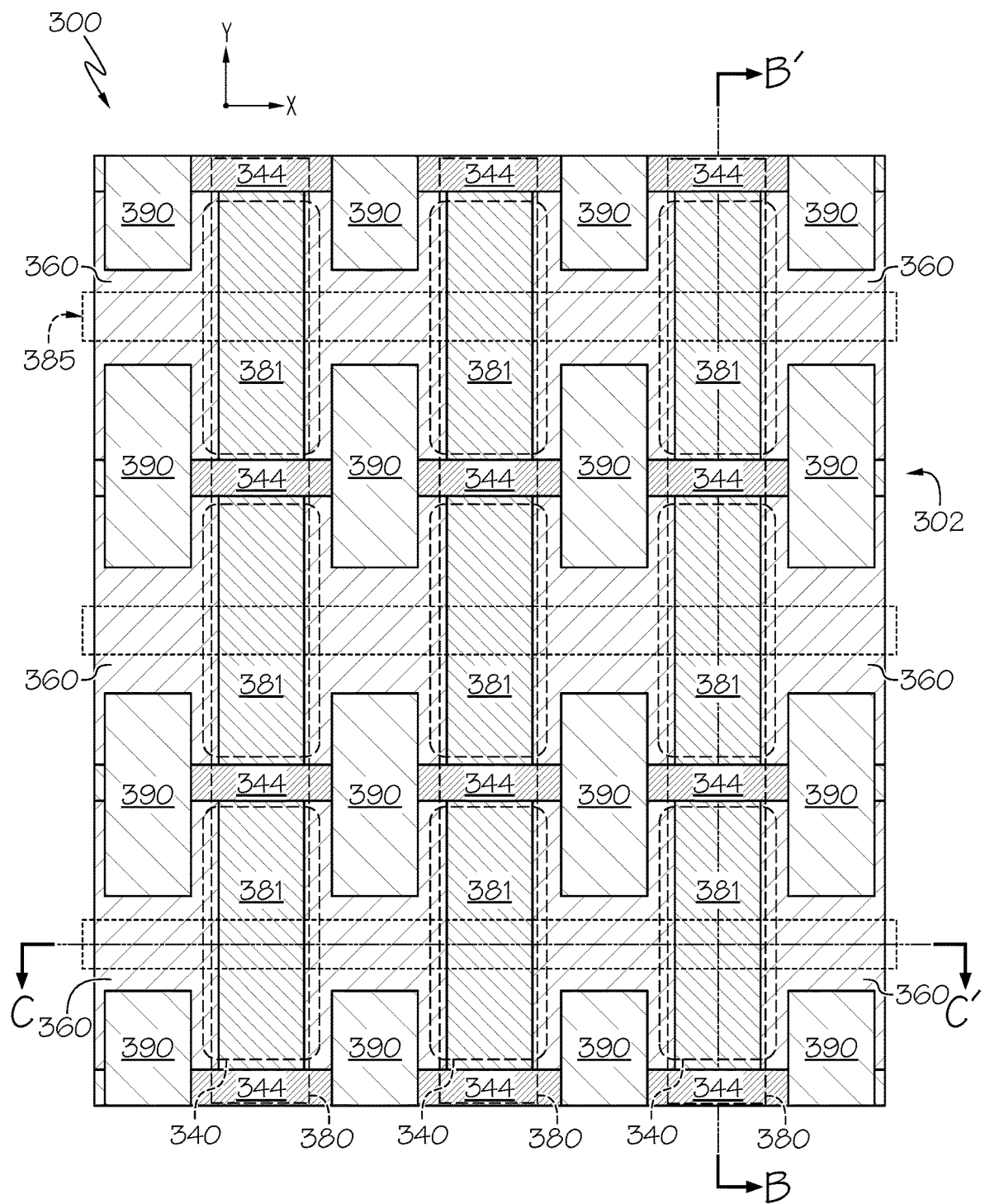
FIG. 3A is a plan view illustrating an example of a gate trench power semiconductor device including channel regions with segmented trenches in accordance with some embodiments of the present disclosure.
Figure 3B:
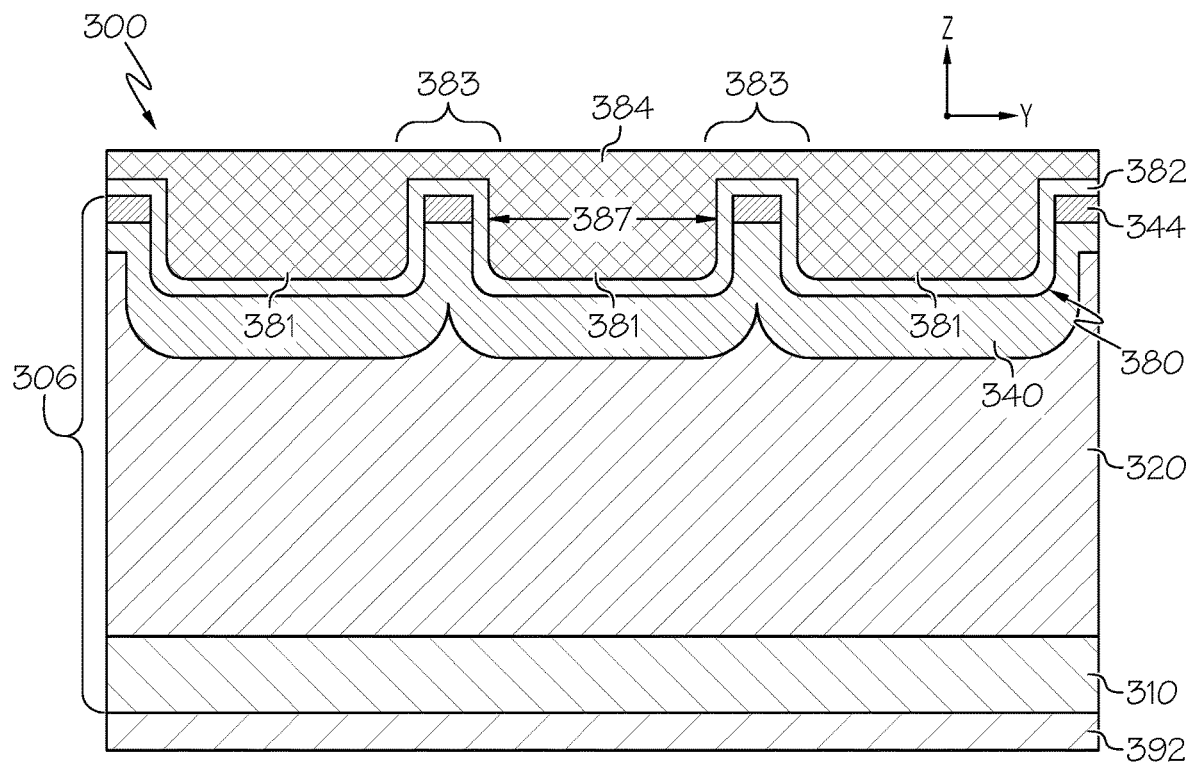
FIG. 3B is a cross-sectional view along one of the segmented trenches of FIG. 3A.
Figure 3C:
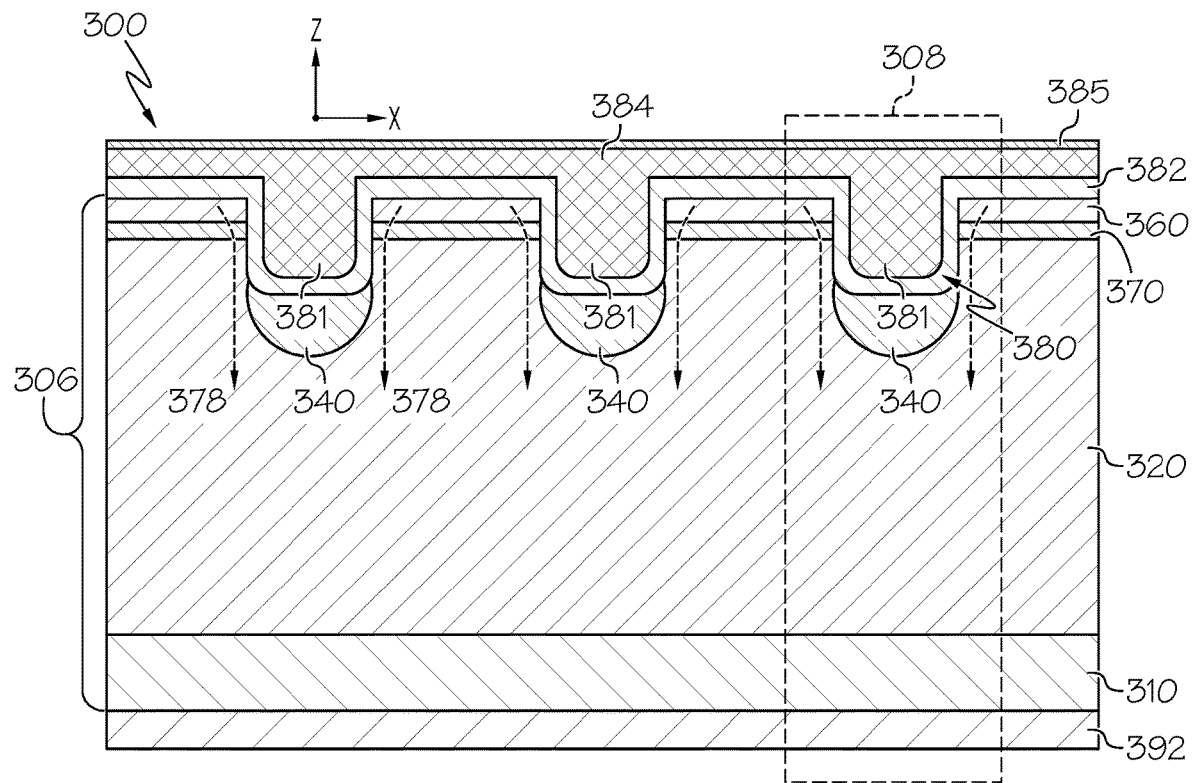
FIG. 3C is a cross-sectional view along a direction perpendicular to the segmented trenches of FIG. 3A.

FIGS. 3A, 3B, and 3C illustrate a segmented trench layout that provides connections to shielding patterns at an upper portion of top surface of trenched vertical power semiconductor devices in accordance with some embodiments of the present disclosure. In particular, FIG. 3A is a plan view illustrating an example of a gate trench power MOSFET 300 including channel regions with segmented trenches in accordance with some embodiments of the present disclosure. FIG. 3B is a cross-sectional view taken along line B-B' of FIG. 3A, that is, along a direction parallel to the longitudinal extension direction of the segmented trenches. FIG. 3C is a cross-sectional view taken along line C-C' of FIG. 3A, that is, along a direction perpendicular to the longitudinal extension direction of the segmented trenches. The gate electrodes and gate oxide layers are shown as transparent in FIG. 3A for ease of illustration.

As shown in FIGS. 3A, 3B, and 3C, the power MOSFET 300 includes an active region 302 and a termination region (not shown) that surrounds the active region 302. FIGS. 3A-3C depict a single power semiconductor device 300 that includes a plurality of unit cells 308 that are electrically connected in parallel. One example unit cell 308 is shown by the dashed rectangle in FIG. 3C. The power MOSFET 300 may include more unit cells 308 than the approximately three unit cells 308 shown in FIG. 3C. It will also be appreciated that a plurality of power MOSFET 300 may be grown on a single wafer.

The power MOSFET 300 includes a heavily-doped (n$^+$) n-type wide band-gap semiconductor substrate 310. The substrate 310 may include, for example, a single crystal silicon carbide semiconductor substrate. The substrate 310 may be doped with n-type impurities (e.g., an n$^+$ silicon carbide substrate). The impurities may comprise, for example, nitrogen or phosphorous. The doping concentration of the substrate 310 may be, for example, between $1 \times 10^{18}$ atoms/cm$^3$ and $1 \times 10^{21}$ atoms/cm$^3$ although other doping concentrations may be used. The substrate 310 may be any appropriate thickness (e.g., between 100 and 500 microns thick in some embodiments).

A lightly-doped (n) n-type drift layer or region 320 (e.g., a silicon carbide drift region) is provided on the substrate 310. The drift region 320 may be formed by epitaxial growth on the substrate 310. The drift region 320 may be a relatively thick region, having a vertical height above the substrate 310 of, for example, 3-100 microns. In some embodiments, an upper portion of the drift region 320 may include an n-type current spreading layer (not shown). A moderately-doped p-type layer is formed (for example, by epitaxial growth or implantation) on the drift region 320 and acts as the p-type well regions ("p-wells") 370 for the device 300. A heavily-doped n$^+$ layer is formed in upper portions of the moderately-doped p-type layer, for example, via ion implantation, to act as the source regions 360 for the device 300. The substrate 310, drift region 320 (including current spreading layer) and the moderately doped p-type layer or p-wells 370, along with the various regions/patterns formed therein, are included in a semiconductor layer structure 306 of the power MOSFET 300.

A plurality of segmented gate trenches 380 extend parallel to one another in a first direction (e.g., the y-direction in FIG. 3A) in the semiconductor layer structure 306. The direction in which the segmented gate trenches 380 extend may also be referred to herein as a longitudinal direction or long axis of the segmented gate trenches 380. As shown in FIG. 3B, each of the segmented gate trenches 380 includes respective gate trench segments 381 that are discontinuous and spaced apart from each other along the first direction, with intervening regions 383 of the semiconductor layer structure 306 therebetween. That is, the trench segments 381 extend along the longitudinal direction and have respective ends 387 that are opposed in the longitudinal direction, with the intervening regions 383 between the ends 387 of adjacent trench segments 381, as shown in FIG. 3B. The trench segments 381 also have sidewalls 378 that extend in the longitudinal direction and are opposed in a direction perpendicular to the longitudinal direction, as shown in FIG. 3C. As also shown in FIG. 3C, the segmented gate trenches 380 extend through the moderately-doped p-type layer and the heavily-doped n$^+$ layer to define the p-wells 370 and the source regions 360, respectively.

Still referring to FIGS. 3A-3C, shielding patterns 340 extend in the first direction (e.g., the y-direction) underneath the trench segments 381 and in the intervening regions 383 between the trench segments 381. For example, after forming the segmented gate trenches 380, a mask may be formed to protect the heavily-doped n$^+$ source regions 360 and expose the segmented trenches 380, and then dopants may be implanted into the top surface of the device 300 to form shielding patterns 340. The shielding patterns 340 are of the opposite conductivity type to the drift region 320. In particular, heavily-doped (pc) p-type shielding patterns 340 are formed in the drift region 320, for example, by ion implantation into the exposed segmented gate trenches 380. The portions of the shielding patterns 340 under the respective trench segments are connected by the portions of the shielding patterns 340 in the intervening regions 383, such that the shielding patterns 340 continuously extend in in the first direction under respective segmented gate trenches 380.

Shielding connection patterns 344 of the same conductivity type as the shielding patterns 340 are provided in the intervening regions 383 between the respective gate trench segments 381. In particular, as shown in FIG. 3B, more heavily-doped (p$^+$ or p$^{++}$) p-type shielding connection patterns 344 are formed, for example, by ion implantation into upper portions of the intervening regions 383 (relative to the bottom of the trench segments 381). The shielding connection patterns 344 extend in a second direction (e.g., the x-direction) adjacent the surface or 'top' of the semiconductor layer structure 306 into which the trench segments 381 extend (e.g., in the z-direction). The shielding connection patterns 344 may also electrically connect the shielding patterns 340 with the p-wells 370.

In the example power MOSFET 300 of FIGS. 3A-3C, the respective gate trench segments 381 of adjacent segmented gate trenches 380 are aligned along the second direction, and the shielding connection patterns 340 continuously extend in the second direction between the trench segments 381. That is, the opposing ends 387 of the trench segments 381 of one segmented gate trench 380 are in-line with opposing ends 387 of the trench segments 381 of an adjacent or neighboring segmented gate trench 380, and the shielding connection patterns 340 continuously extend in the intervening regions 383 between the opposing ends 387 of the trench segments 381. The shielding connection patterns 344 thus provide electrical connection to the shielding patterns 340 adjacent the upper surface or top of the device 300. In particular, as shown in FIG. 3A, respective source contacts 390 are provided on the shielding connection patterns 344 between adjacent segmented gate trenches 380, and may be used to electrically connect the shielding patterns 340 to an electrical ground.

As shown in FIG. 3C, each of the opposing sidewalls 378 of the gate trench segments 381 includes portions that are free of the shielding patterns 340. For example, the shielding patterns 340 may be selectively formed at the bottom of the trench segments 381 but not on the sidewalls 378 by protecting (e.g., masking) the sidewalls 378 and/or by forming the sidewalls 378 with a substantially vertical profile in order to avoid ion implantation into the sidewalls 378 in formation of the shielding patterns 340.

The absence of the shielding patterns 340 at portions of the opposing sidewalls 378 allow for (here, n-type) channel regions and conduction (shown by dashed arrows in FIG. 3C) at both sidewalls 378 of the gate trench segments 381, rather than at only one sidewall 178 (as shown in FIG. 1). That is, both sidewalls 378 of the respective gate trench segments 381 provide portions of the channel region or conducting area of the device 300. Also, as the source regions 360 (and source contacts 390, as shown in FIG. 3A) are provided in and on regions of the semiconductor layer structure 306 between the segmented gate trenches 380, channel regions or conducting areas are provided at both sidewalls 378 of immediately adjacent segmented gate trenches 380, rather than at sidewalls 278 of alternating gate trenches 180 (as shown in FIG. 2). As such, the confining of the shielding patterns 340 below the bottom surfaces of the trench segments 381 may provide power devices 300 having a conducting area (in particular, conducting areas of the sidewalls 378 of the trench segments 381) that is greater than half of the total trench area (in particular, greater than about 50%, greater than about 66%, or greater than about 75% of the total trench sidewall area) of the segmented gate trenches 380. In other words, greater than one-half of the total or collective trench area (and in particular, the total trench sidewall area) of the device 300 is used as conducting area, which may not be achievable in some conventional trenched power semiconductor devices where significant portions (e.g., 50% or more) of the collective trench sidewall area may be dedicated to blocking without conduction.

The lengths of the trench segment and intervening areas therebetween may also be adjusted to increase the conduction area. For example, if the lengths of the trench segments and the connector regions in between were identical, 50% of the trench sidewalls (compared to unsegmented trenches) may be used for conduction. With trench segments having double the connector length, 66% of the potential (e.g., unsegmented) trench length may be used for conduction. In some embodiments, the trench segments may be long enough to be effectively utilizing 75% or more of the possible sidewall area.

A gate insulating layer 382 is provided on the bottom surface and sidewalls of each trench segment 381, and a gate electrode (or "gate") 384 is provided on the gate insulating layer 382 to fill the respective trench segments 381. As shown in FIGS. 3B and 3C, the gate insulating layer 382 and gate 384 are illustrated as extending in areas outside of the trench segments 381, but embodiments of the present disclosure are not limited thereto. Portions of the respective channel regions are defined in the p-wells 370 adjacent the gate insulating layer 382.

The power MOSFET 300 also includes gate, drain, and source contacts. In particular, the drain contact 392 is provided on the lower surface of the substrate 310. The gate contact is provided on each gate electrode 384. For example, in some embodiments, the gate electrodes 384 may be patterned to provide connections therebetween. Also, as shown in FIGS. 3A and 3C, gate electrode connectors 385 are provided on respective gate electrodes 384. The gate electrode connectors 385 may be or may include optional connector layer(s), which may be patterned or otherwise configured to connect the respective gate electrodes 384, for example, to improve conduction. In some embodiments, the gate electrode connectors 385 may be formed of a high conductivity layer, such as a nitride (e.g., TiN, TaN, WN) or metallic layer (e.g., to form a silicide), on the underlying gate electrodes 384 (e.g., Si). The gate electrode connectors 385 extend in the second direction between the respective shielding connection patterns 344 and the source contacts 390 thereon.

The source contacts 390 are formed on respective shielding connection patterns 344. In some embodiments, the source contacts 390 are formed on portions of the respective shielding connection patterns 344 that extend in the second direction beyond the intervening regions 383 and into portions of the semiconductor layer structure 306 between adjacent segmented gate trenches 380, such that the source contacts 390 may be larger in area. The source contacts 390 may provide an electrical connection to the shielding patterns 340 through the respective shielding connection patterns 344 at the upper surface of the device 300. The source contacts 390 may be ohmic metal in some embodiments, and may be configured to electrically connect the shielding patterns 340 to an electrical ground.

Figure 4A:
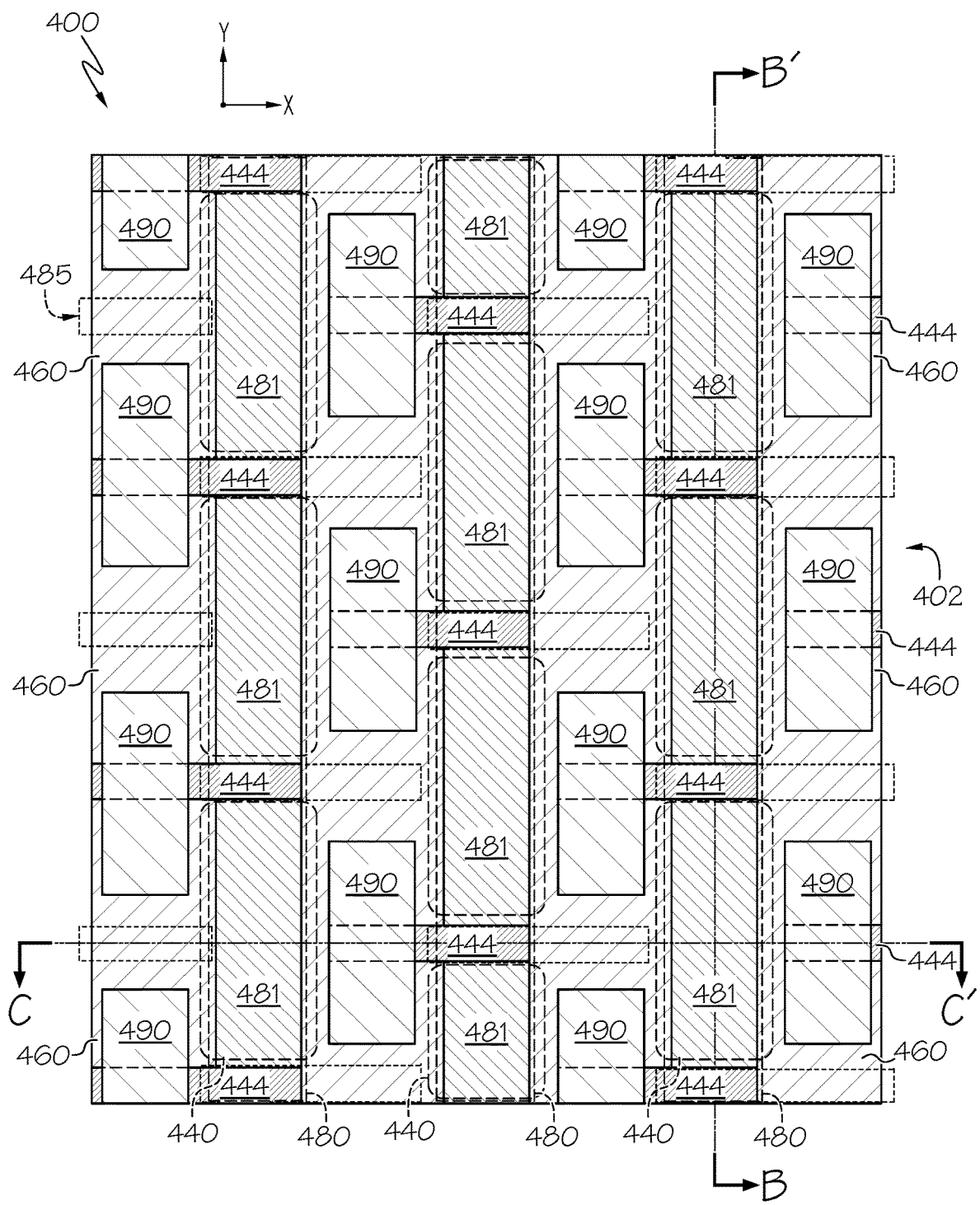
FIG. 4A is a plan view illustrating an example of a gate trench power semiconductor device including channel regions with segmented trenches in accordance with further embodiments of the present disclosure.
Figure 4B:
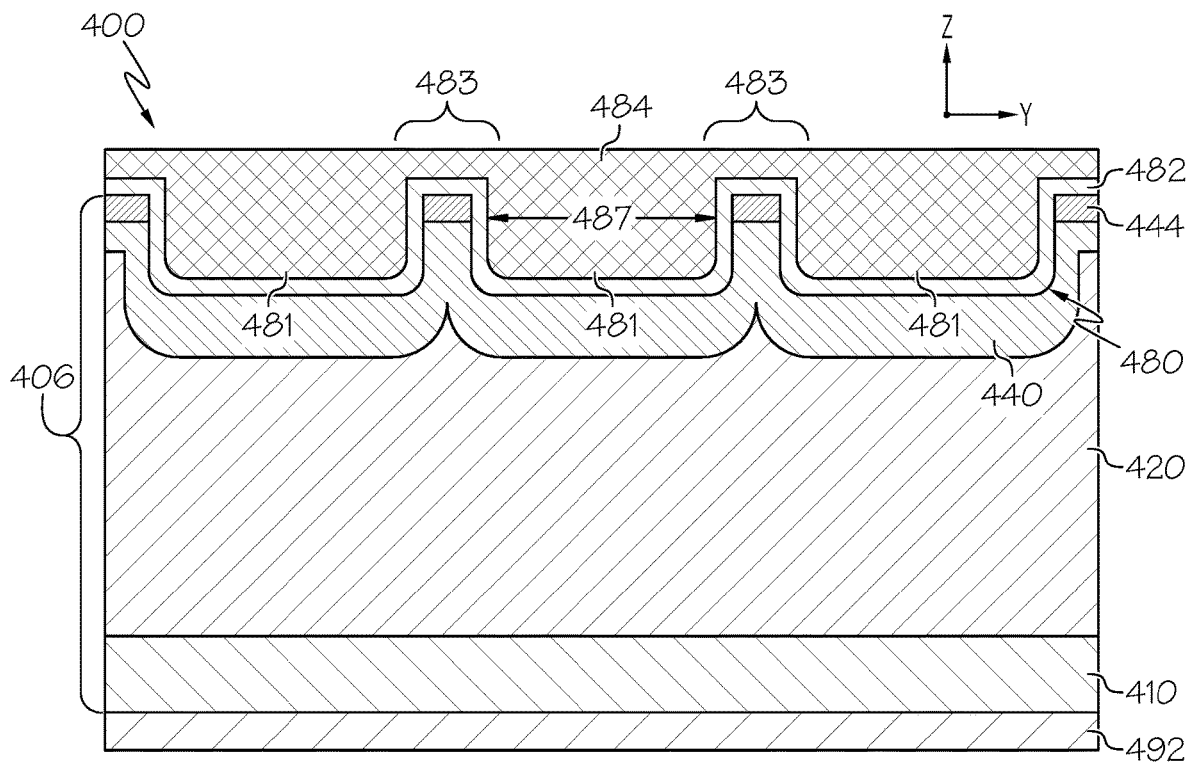
FIG. 4B is a cross-sectional view along one of the segmented trenches of FIG. 4A.
Figure 4C:
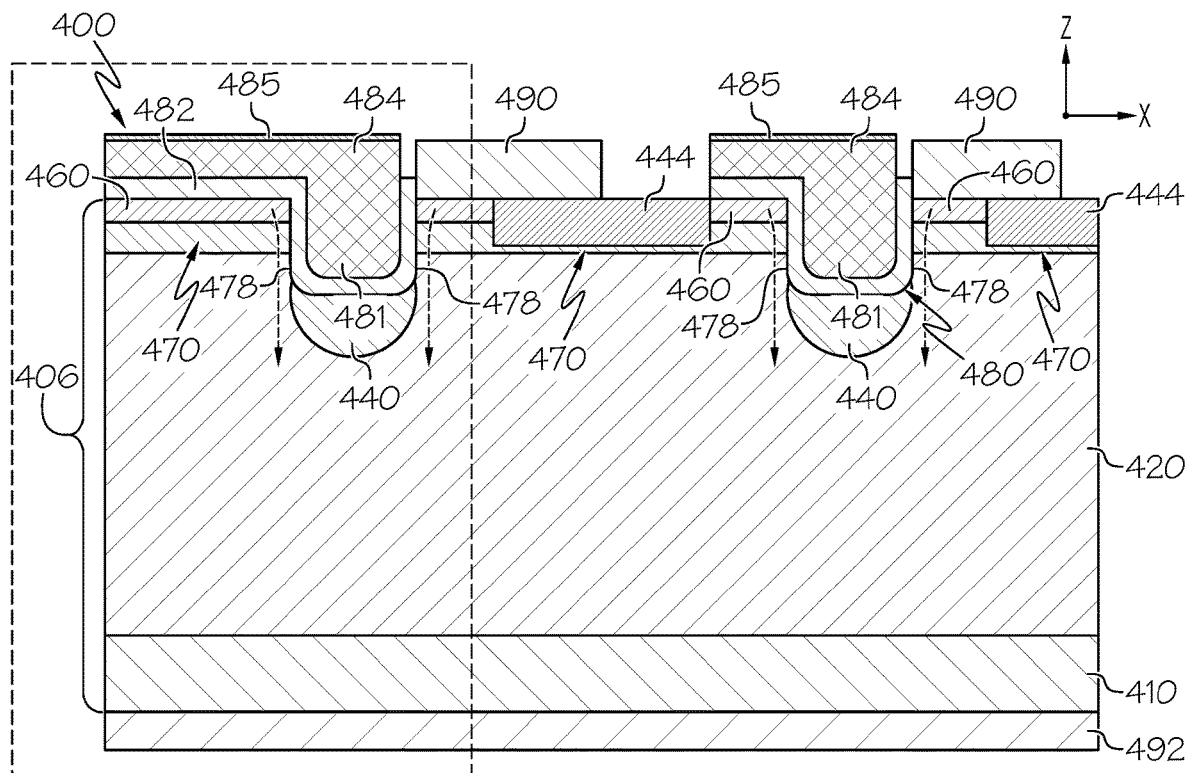
FIG. 4C is a cross-sectional view along a direction perpendicular to the segmented trenches of FIG. 4A.

FIGS. 4A, 4B, and 4C illustrate a segmented trench layout that provides connections to shielding patterns at a top region of trenched vertical power semiconductor devices in accordance with further embodiments of the present disclosure. In particular, FIG. 4A is a plan view illustrating an example of a gate trench power MOSFET 400 including channel regions with segmented trenches, FIG. 4B is a cross-sectional view taken along line B-B' of FIG. 4A (along a direction parallel to the longitudinal extension direction of the segmented trenches), and FIG. 4C is a cross-sectional view taken along line C-C' of FIG. 4A (along a direction perpendicular to the longitudinal extension direction of the segmented trenches). The gate electrodes and gate oxide layers are shown as transparent in FIG. 4A for ease of illustration.

In comparison to the power MOSFET 300, the power MOSFET 400 includes gate trench segments 481 that are staggered or offset relative to (rather than aligned with) the trench segments 481 of an adjacent or neighboring segmented gate trench 480 in the direction perpendicular to the extension direction of the segmented gate trenches 480. This offset trench segment arrangement of the device 400 positions the shielding connection patterns 444 closer to the central areas of the trench segments 481, which can reduce resistance at the trench sidewalls 478 to provide improved high frequency performance.

As shown in FIGS. 4A, 4B, and 4C, the power MOSFET 400 includes an active region 402 and a termination region (not shown) that surrounds the active region 402, depicted as a single power semiconductor device 400 that includes a plurality of unit cells 408 that are disposed in parallel. One example unit cell 408 is shown by the dashed rectangle in FIG. 4C. The power MOSFET 400 may include more unit cells 308 than the approximately two unit cells 408 shown in the cross section of FIG. 4C, and a plurality of power MOSFETs 400 may be grown on a single wafer.

The power MOSFET 400 includes a heavily-doped ($n^+$) n-type wide band-gap semiconductor substrate 410, for example, a single crystal silicon carbide semiconductor substrate, which may be doped with n-type impurities, and may otherwise be similar to the substrate 310 of FIGS. 3A-3C. A lightly-doped (n) n-type drift layer or region 420 is provided on the substrate 410, for example, by epitaxial growth. The drift region 420 may include a current spreading layer, and may otherwise be similar to the drift region 320. A moderately-doped p-type layer is provided (for example, by epitaxial growth or implantation) on the drift region 420 and acts as the p-type well regions ("p-wells") 470 for the device 400. A heavily-doped $n^+$ layer is formed in upper portions of the moderately-doped p-type layer, for example, via ion implantation, to act as the source regions 460 for the device 400. The substrate 410, drift region 420 (including current spreading layer) and the moderately doped p-type layer or p-wells 470, along with the various regions/patterns formed therein, are included in a semiconductor layer structure 406 of the power MOSFET 400.

A plurality of segmented gate trenches 480 extend parallel to one another in a first or longitudinal direction (e.g., the y-direction in FIG. 4A) in the semiconductor layer structure 406. As shown in FIG. 4B, each of the segmented gate trenches 480 includes respective gate trench segments 481 that are discontinuous and spaced apart from each other along the first direction, with intervening regions 483 of the semiconductor layer structure 406 therebetween. That is, the trench segments 481 extend along the longitudinal direction and have respective ends 487 that are opposed in the longitudinal direction, with the intervening regions 483 between the ends 487 of adjacent trench segments 481, as shown in FIG. 4B. The trench segments 481 also have sidewalls 478 that extend in the longitudinal direction and are opposed in a direction perpendicular to the longitudinal direction, as shown in FIG. 4C. As also shown in FIG. 4C, the segmented gate trenches 480 extend through the moderately-doped p-type layer and the heavily-doped $n^+$ layer to define the p-wells 470 and the source regions 460, respectively. As shown in the plan view of FIG. 4A, the respective gate trench segments 481 of adjacent segmented gate trenches 480 are offset along a second direction (e.g., the x-direction in FIG. 4A) that is perpendicular to the first or longitudinal direction.

Shielding patterns 440 extend in the first direction underneath the trench segments 481 and in the intervening regions 483 between the trench segments 481. For example, after forming the segmented gate trenches 480, a mask may be formed to protect the heavily-doped $n^+$ source regions 460 and expose the segmented trenches 480, and then dopants may be implanted into the top surface of the device 400 to form shielding patterns 440. The shielding patterns 440 are of the opposite conductivity type to the drift region 420. In particular, heavily-doped (pc) p-type shielding patterns 440 are formed in the drift region 420, and may be similar to the shielding patterns 340. The portions of the shielding patterns 440 under the respective trench segments are connected by the portions of the shielding patterns 440 in the intervening regions 483, such that the shielding patterns 440 continuously extend in in the first direction under respective segmented gate trenches 480.

Shielding connection patterns 444 of the same conductivity type as the shielding patterns 440 are provided in the intervening regions 483 between the respective gate trench segments 481. In particular, as shown in FIG. 4B, more heavily-doped ($p^+$ or $p^{++}$) p-type shielding connection patterns 444 are formed, for example, by ion implantation into upper portions of the intervening regions 483. The shielding connection patterns 444 extend in a second direction (e.g., in the x-direction) adjacent the surface or top of the semiconductor layer structure 406 into which the trench segments 481 extend (e.g., in the z-direction). The shielding connection patterns 444 may also electrically connect the shielding patterns 440 with the p-wells 470. In the example power MOSFET 400 of FIGS. 4A-4C, the respective gate trench segments 481 of adjacent segmented gate trenches 480 are staggered or offset along the second direction, and the shielding connection patterns 444 discontinuously extend in the second direction between the trench segments 481. That is, the opposing ends 487 of the trench segments 481 of one segmented gate trench 480 are not in-line with opposing ends 487 of the trench segments 481 of an adjacent or neighboring segmented gate trench 480, and the shielding connection patterns 444 are separated (or segmented) along the second direction by one or more intervening segmented gate trenches 480.

In other words, as the trench segments 481 are staggered or offset relative to one another in the second direction, the respective shielding connection patterns 444 extend from an intervening region 483 between trench segments 481 to an adjacent contact (in particular, to a source contact 490), and the shielding connection patterns 444 are thus discontinuous segments (rather than the continuous 'stripes' of the shielding connection patterns 344). The shielding connection patterns 444 thus provide electrical connection to the shielding patterns 440 adjacent the upper surface or top of the device 400. In particular, as shown in FIG. 4A, respective source contacts 490 are provided on the shielding connection patterns 444 between adjacent segmented gate trenches 480, and may be used to electrically connect the shielding patterns 440 to an electrical ground. FIG. 4A also illustrates that the device 400 includes shielding connection patterns 444 at not only the opposing ends 487 of the trench segments 481, but also adjacent central portions of each trench segment 481. The device 400 thus includes more connection patterns 444 per channel region (as defined at the opposing sidewalls 478 of the trench segments 481) than the device 300. The presence of additional shielding connection patterns 444 per channel region may allow the device 400 to achieve lower resistance conduction. In particular, providing additional shielding connection patterns 444 adjacent central areas of the trench segments 481 can reduce resistance and thus improve conduction at the trench sidewalls 478, particularly in higher frequency applications.

FIG. 4C illustrates a shielding connection pattern 444 that adjacent the sidewalls 478 of the gate trench segments 481. Also, each of the opposing sidewalls 478 of the gate trench segments 481 includes portions that are free of the shielding patterns 440. For example, the shielding patterns 440 may be selectively formed at the bottom of the trench segments 481 but not on the sidewalls 478 by protecting (e.g., masking) the sidewalls 478 and/or by forming the sidewalls 478 with a substantially vertical profile (in order to avoid ion implantation into the sidewalls 378 in formation of the shielding patterns 340), similar to the sidewalls 478.

The absence of the shielding patterns 440 at portions of the opposing sidewalls 478 allow channel regions and conduction (shown by dashed arrows in FIG. 4C) at both sidewalls 478 of the gate trench segments 481, such that both sidewalls 478 provide portions of the channel region or conducting channel area of the device 400. Also, as the source regions 460 (and source contacts 490, as shown in FIG. 4A) are provided in and on regions of the semiconductor layer structure 406 between the segmented gate trenches 480, conducting channel regions or areas are provided at both sidewalls 478 of immediately adjacent segmented gate trenches 480. Similar to the discussion of FIG. 3A, the confining of the shielding patterns 440 below the bottom surfaces of the trench segments 481 may provide trenched vertical power semiconductor devices 400 having a conducting area (in particular, conducting areas at the sidewalls of the trench segments 481) that is greater than half of the total trench area (in particular, the total trench sidewall area) of the segmented gate trenches 480.

A gate insulating layer 482 is provided on the bottom surface and sidewalls of each trench segment 481, and a gate 484 is provided on the gate insulating layer 482 to fill the respective trench segments 481. Portions of the respective channel regions are defined in the p-wells 470 adjacent the gate insulating layer 482.

The power MOSFET 400 also includes gate, drain, and source contacts. In particular, the drain contact 492 is provided on the lower surface of the substrate 410. The gate contact is provided on each gate electrode 484, for example, as gate electrode connectors 485 on respective gate electrodes 484. The gate electrode connectors 485 extend in the second direction between the respective shielding connection patterns 444, and more particularly, between the source contacts 490 on the shielding connection patterns 444. The source contacts 490 are formed on the portions of the respective shielding connection patterns 444 that extend in the second direction beyond the intervening regions 483 and into portions of the semiconductor layer structure 406 between adjacent segmented gate trenches 480. The source contacts 490 may provide an electrical connection to the shielding patterns 440 through the respective shielding connection patterns 444 at the upper surface of the device 400, and may be ohmic metal and/or configured to electrically connect the shielding patterns 440 to an electrical ground.

While described and illustrated in FIGS. 3A-3C and 4A-4C with reference to particular arrangements of trench segments with shielding patterns thereunder and shielding connection patterns therebetween of specific conductivity types, it will be understood that embodiments of the present disclosure are not limited to these examples and may be varied. For example, the gate electrode connectors 385 and 485 are illustrated as being present between each adjacent source contact 390 and 490 along the first direction in FIGS. 3A and 4A, respectively, but in some embodiments the gate electrode connectors 385 and/or 485 may be positioned between every-other source contact (or every-third source contact, etc.) Likewise, the gate electrode connectors 385 and 485 may be staggered to allow for larger-area source/ohmic contacts. Similarly, the shielding connection patterns 344 and 444 are illustrated as being present between each trench segment 381 and 481 along the first direction in FIGS. 3A and 4A, respectively, but in some embodiments the shielding connection patterns 344 and/or 444 may be arranged between every-other trench segment (or every-third trench segment, etc.)

Also, while illustrated as being offset or staggered between immediately adjacent segmented gate trenches 480 in FIG. 4A (with the trench segments 481 of each segmented trench 480 being offset by one-half of the length of a trench segment 481 in the y-direction), the trench segments 481 may be offset or staggered relative to every two segmented trenches 480 (e.g., with the trench segments 481 of each segmented trench 480 being offset by one-third of the length of a trench segment 481 in the y-direction), every three segmented trenches 480 (e.g., with the trench segments 481 of each segmented trench 480 being offset by one-fourth of the length of a trench segment 481 in the y-direction), etc. More generally, the periodicity of the shielding connection patterns and/or gate electrode connectors (e.g., along the y-direction), and/or the periodicity of the staggering or offset of the trench segments of adjacent segmented trenches (e.g., along the x-direction) may be varied in accordance with embodiments of the present disclosure relative to the examples shown in FIGS. 3A and 4A.

Figure 5B:
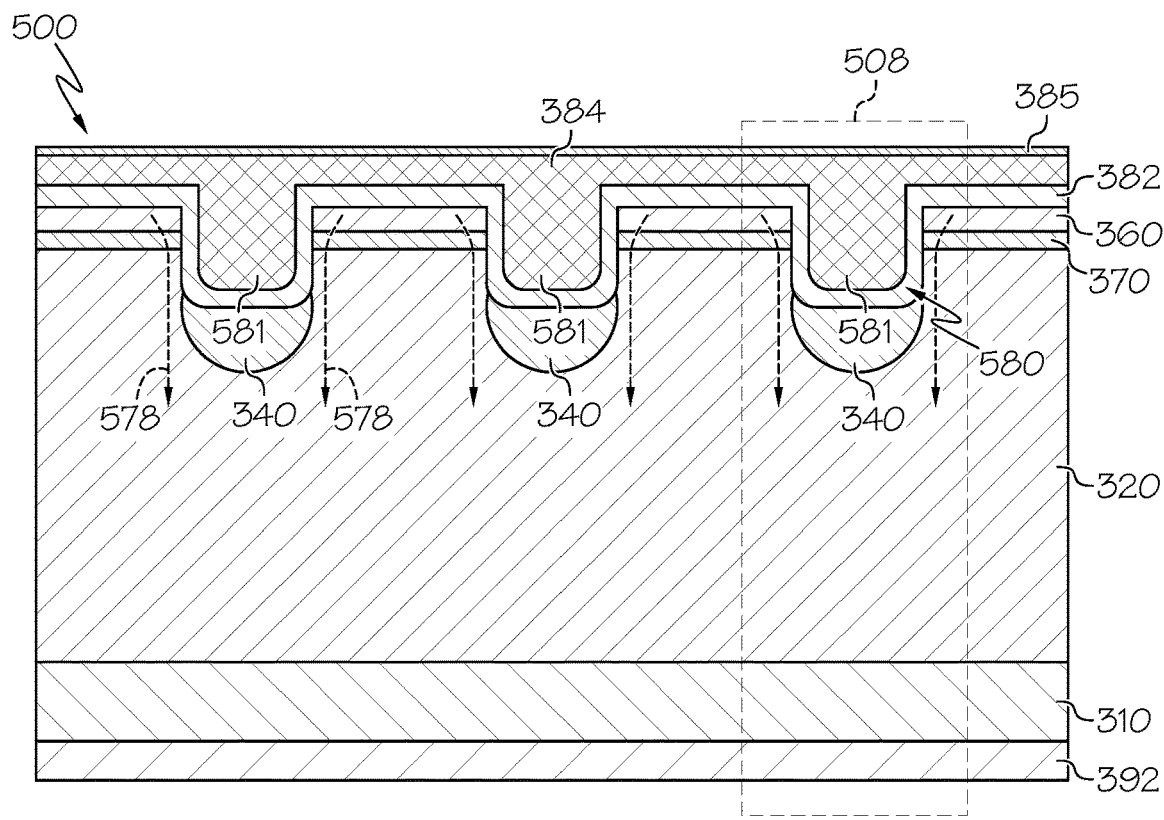

FIGS. 5A and 5B are cross-sectional views along parallel and perpendicular directions, respectively, relative to a longitudinal direction of extension of segmented gate trenches 580 of a trenched vertical power semiconductor device 500 in accordance with further embodiments of the present disclosure. In the device 500, the respective lengths of the trench segments 581 of the segmented trenches 580 along the first, longitudinal direction may be varied to provide fewer, longer trench segments 581 per unit cell 508 (with greater conducting channel area 578 per trench segment 581 or unit length) and/or fewer shielding connection patterns 544 in the intervening regions 583 between trench segments 581. Conversely, the respective lengths of the trench segments 581 along the first, longitudinal direction may be varied to provide a greater number of shorter trench segments (with smaller conducting channel area per trench segment or unit length) and/or more shielding connection patterns in the intervening regions between trench segments.

Figure 6A:
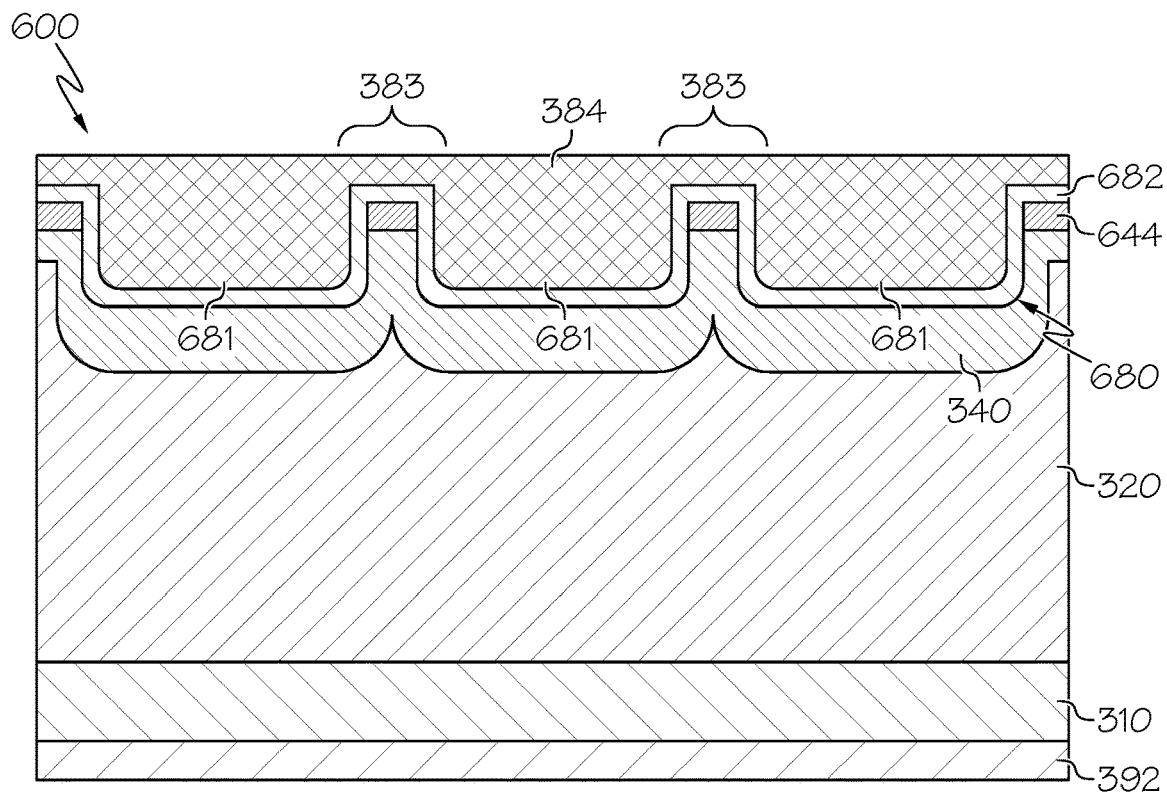
FIGS. 6A and 6B are cross-sectional views along parallel and perpendicular directions, respectively, relative to a direction of extension of segmented trenches in a gate trench power semiconductor device accordance with further embodiments of the present disclosure.
Figure 6B:
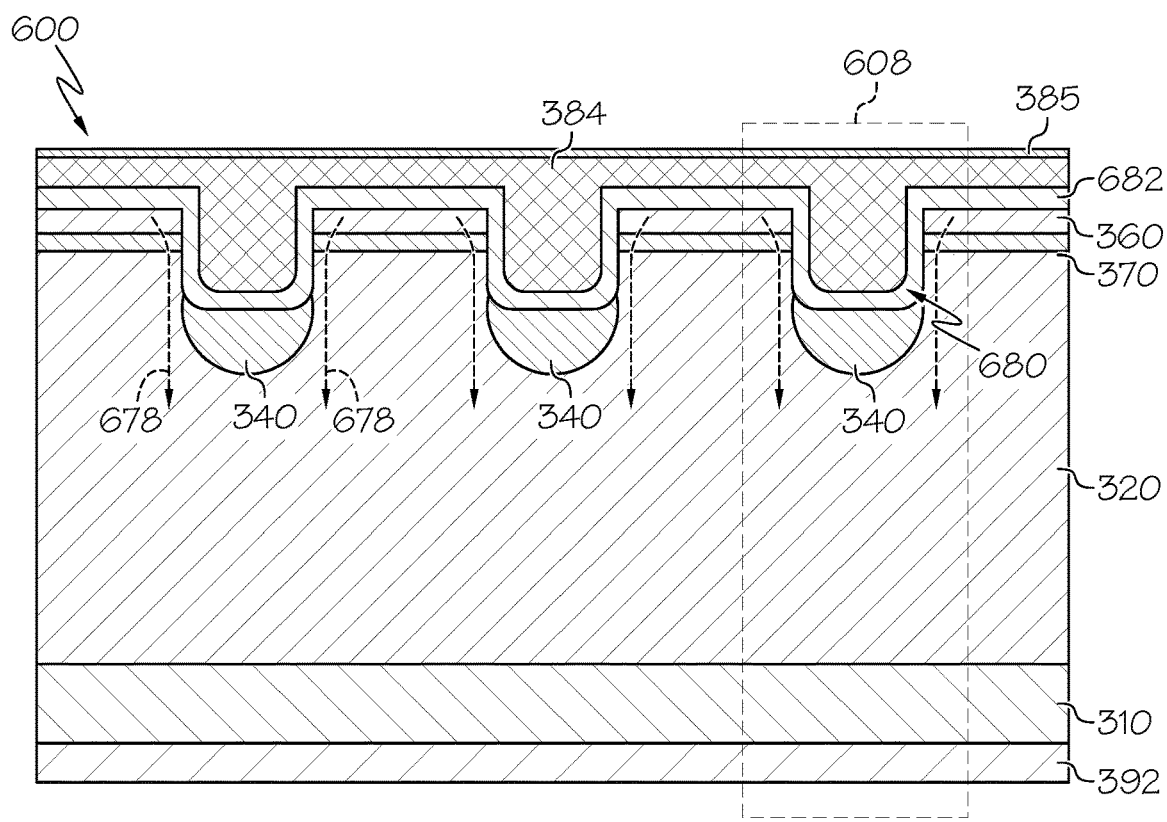

FIGS. 6A and 6B are cross-sectional views along parallel and perpendicular directions, respectively, relative to a longitudinal direction of extension of segmented gate trenches 680 of a trenched vertical power semiconductor device 600 in accordance with further embodiments of the present disclosure. In the device 600, the respective widths of the segmented trenches 680 along the second direction (perpendicular to the longitudinal extension direction of the trenches 680) may be varied to provide wider trench segments 681 per unit cell 608 and/or narrower source contacts 390 on the semiconductor layer structure between segmented trenches 680. Conversely, the respective widths of the segmented trenches 680 along the second, perpendicular direction may be varied to provide narrower trench segments and/or wider source contacts between segmented trenches.

Methods of fabricating trenched power semiconductor devices including segmented trenches with intervening regions of the semiconductor layer structure between respective trench segments, deep shielding patterns, and shielding connection patterns in accordance with embodiments of the present disclosure will be described below with reference to FIGS. 7-9. In particular, FIGS. 7A-7H illustrate methods of fabricating a gate trench power MOSFET 700, where FIGS. 7A, 7C, 7E, and 7G are cross-sectional views along a direction parallel to the longitudinal extension direction of the segmented trenches, while FIGS. 7B, 7D, 7F, and 7H are cross-sectional views along a direction perpendicular to the longitudinal extension direction of the segmented trenches. FIGS. 8A-8H illustrate further methods of fabricating a gate trench power MOSFET 800, where FIGS. 8A, 8C, 8E, and 8G are cross-sectional views along a direction parallel to the longitudinal extension direction of the segmented trenches, while FIGS. 8B, 8D, 8F, and 8H are cross-sectional views along a direction perpendicular to the longitudinal extension direction of the segmented trenches. FIG. 9 is a flowchart illustrating operations for fabricating gate trench power semiconductor devices in accordance with embodiments of the present disclosure, and is described below with reference to forming the MOSFETs 700 and 800.

Referring now to FIG. 9, a wide band-gap semiconductor layer structure is formed at block 900. The semiconductor layer structure may include a substrate and a plurality of semiconductor layers that are grown on the substrate by epitaxial growth. The semiconductor layer structure may include a drift region that has a first conductivity type. The semiconductor layer structure may further include well regions having a second conductivity type on the drift region.

For example, as shown in FIGS. 7A-7B and 8A-8B, a heavily-doped (n+) n-type substrate 310 is provided that includes an active region 302 (only the active region 302 is shown). A lightly-doped (n−) drift region 320 is formed on the substrate 310 via epitaxial growth. An n-type current spreading layer may be formed in the upper portion of the n-type drift layer 320. A moderately-doped p-type layer (which will form the p-wells 370) is formed on the upper surface of n-type drift layer 320. The layers 310, 320, 330, 370 may all be grown in a single epitaxial growth process with process stops to switch between n-type doping and p-type doping to form a wide bandgap semiconductor layer structure 306 (block 900).

At block 910, segmented gate trenches are formed in an upper surface of the semiconductor layer structure. The segmented gate trenches extend in a first direction and are spaced apart from each other in a second direction that is perpendicular to the first direction. Each segmented gate trench includes a plurality of gate trench segments that are spaced apart from each other in the first direction, with intervening regions of the semiconductor layer structure between respective gate trench segments. The respective gate trench segments include opposing sidewalls that extend in the first direction, and a bottom surface or floor therebetween.

Figure 7A:
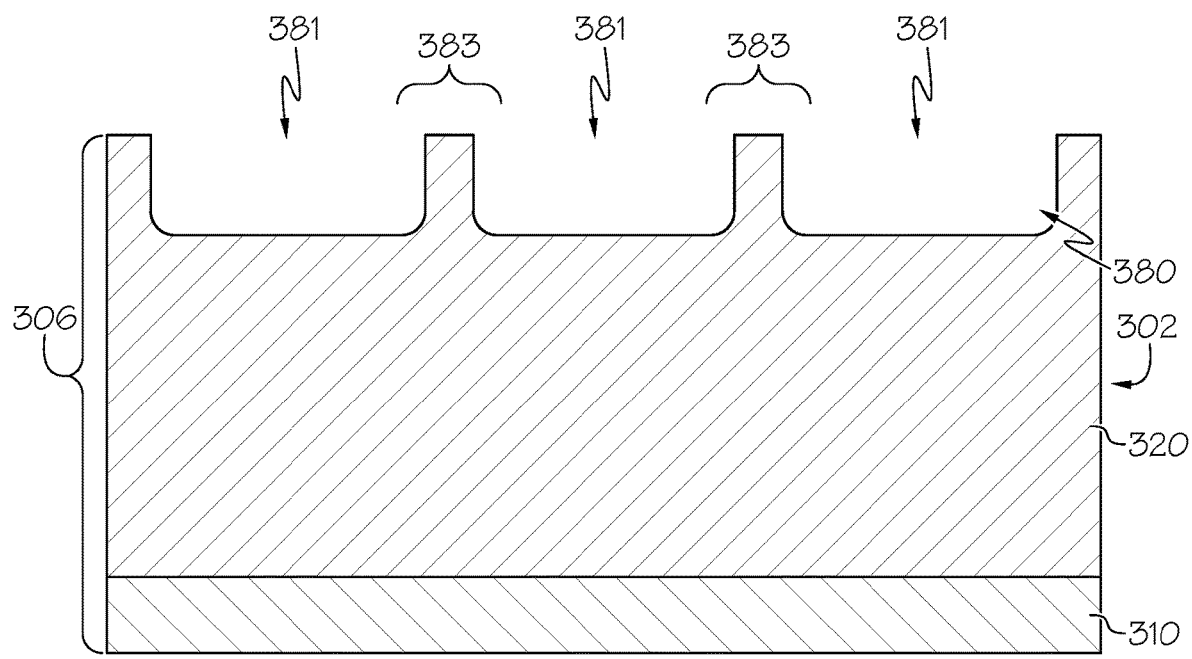
FIGS. 7A-7H illustrate methods of fabricating gate trench power semiconductor devices in accordance with some embodiments of the present disclosure, where
Figure 7B:
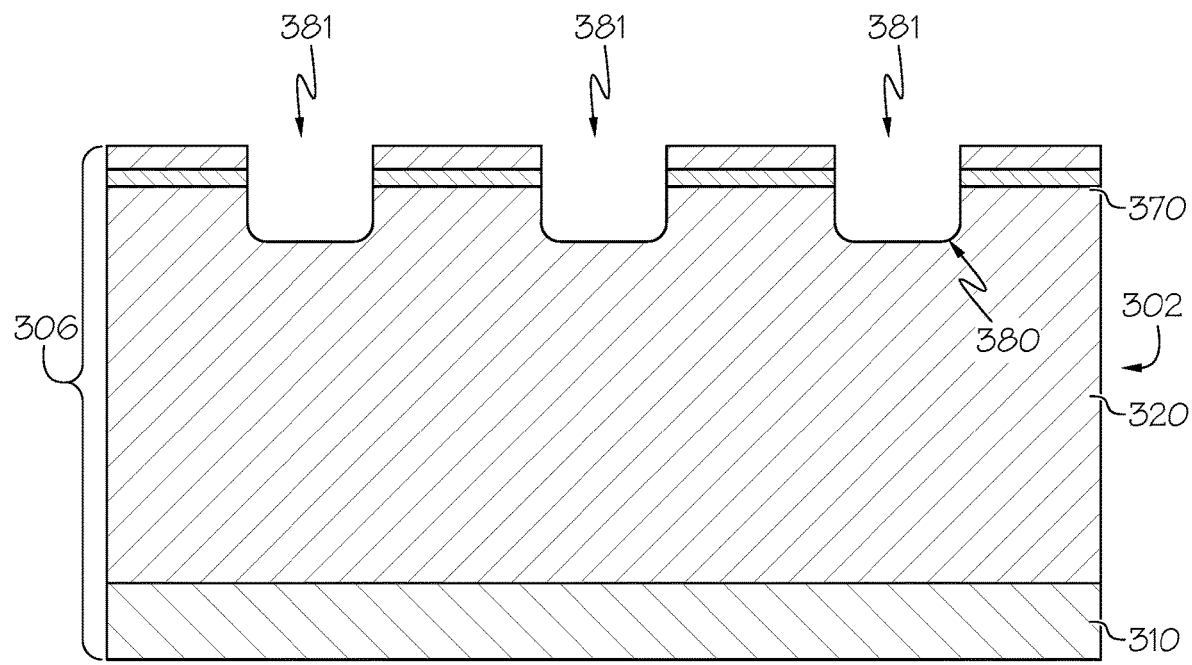
Figure 8A:
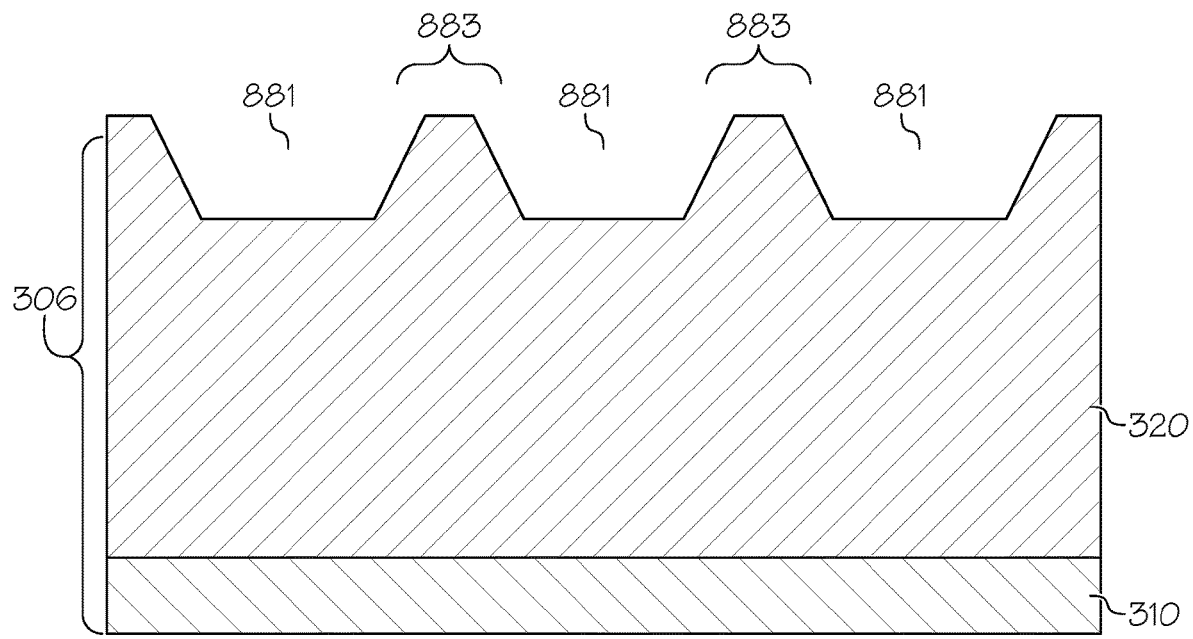
FIGS. 8A-8H illustrate further methods of fabricating gate trench power semiconductor devices in accordance with some embodiments of the present disclosure, where
Figure 8B:
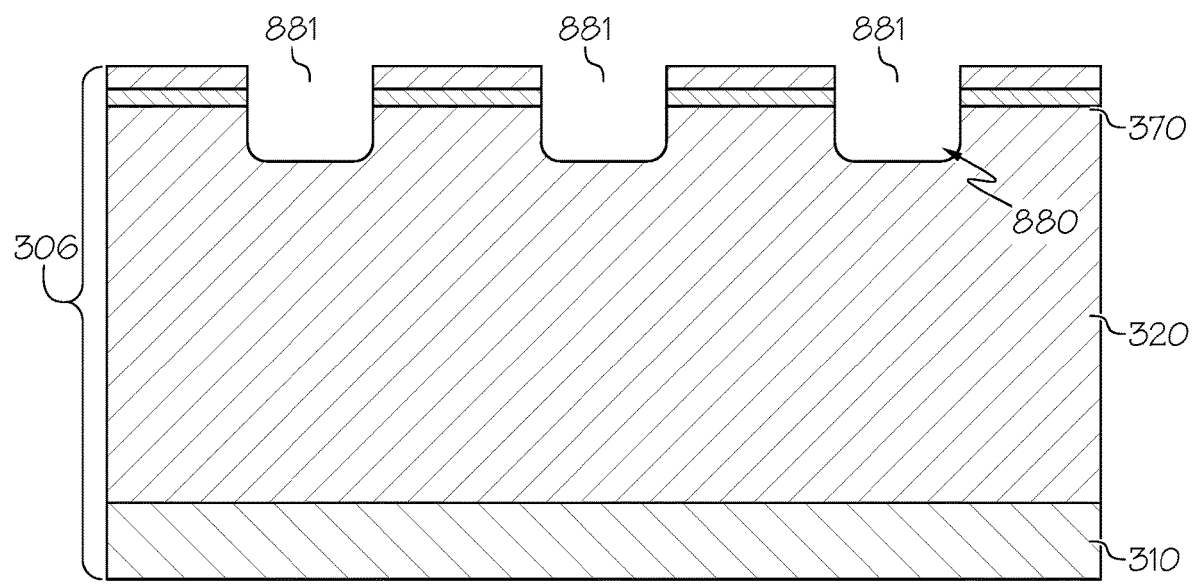
Figure 9:
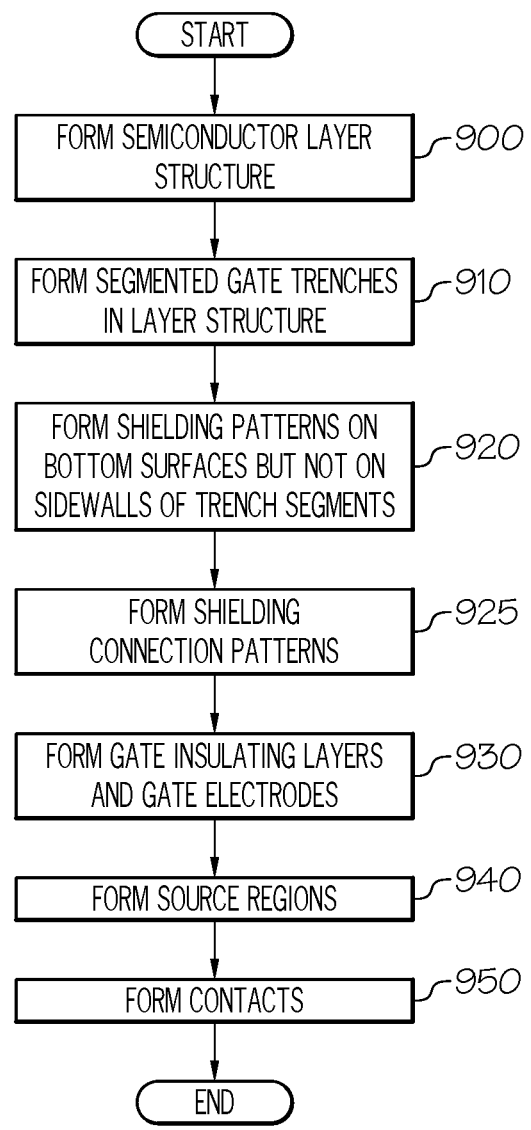
FIG. 9 is a flowchart illustrating operations for fabricating gate trench power semiconductor devices in accordance with embodiments of the present disclosure.

For example, still referring to FIGS. 7A-7B and 8A-8B, segmented gate trenches 380 and 880, respectively, are formed by etching into the upper surface of the semiconductor layer structure 306. The segmented gate trenches 380 and 880 may each extend in parallel in a first, longitudinal direction and may be spaced apart from each other in a second direction that is perpendicular to the first direction. The segmented gate trenches 380 and 880 may extend through the moderately-doped p-type silicon carbide layer to define a plurality of p-wells 370. The segmented gate trenches 380, 880 each include respective gate trench segments 381, 881 that are spaced apart from each other along the longitudinal extension direction with intervening regions 383, 883 of the semiconductor layer structure between trench segments 381, 881. In FIG. 7A, the trench segments 381 are formed with ends that are substantially vertical or perpendicular relative to the bottom surfaces thereof, defining U-shaped cross-sections along the longitudinal extension direction. In FIG. 8A, the trench segments 881 are formed with ends that are sloped or inclined relative to the bottom surfaces thereof.

Referring again to FIG. 9, after forming the segmented gate trenches in the semiconductor layer structure, shielding patterns having a second conductivity type that is opposite the first conductivity type are selectively formed in the floors or bottom surfaces of the respective trench segments and in the intervening regions of the semiconductor layer structure between the trench segments, but not in the opposing sidewalls of the respective trench segments, at block 920. In particular, the shielding patterns may be formed using an ion implantation process to implant dopant ions into the bottom surface and opposing end surfaces of each trench segment along the longitudinal extension direction of the segmented trenches, without implanting ions into the opposing sidewalls of each trench segment in the direction perpendicular to the longitudinal direction. As the opposing sidewalls of the respective trench segments are not implanted, channel regions for the device are provided on both sides of each trench segment.

Figure 7C:
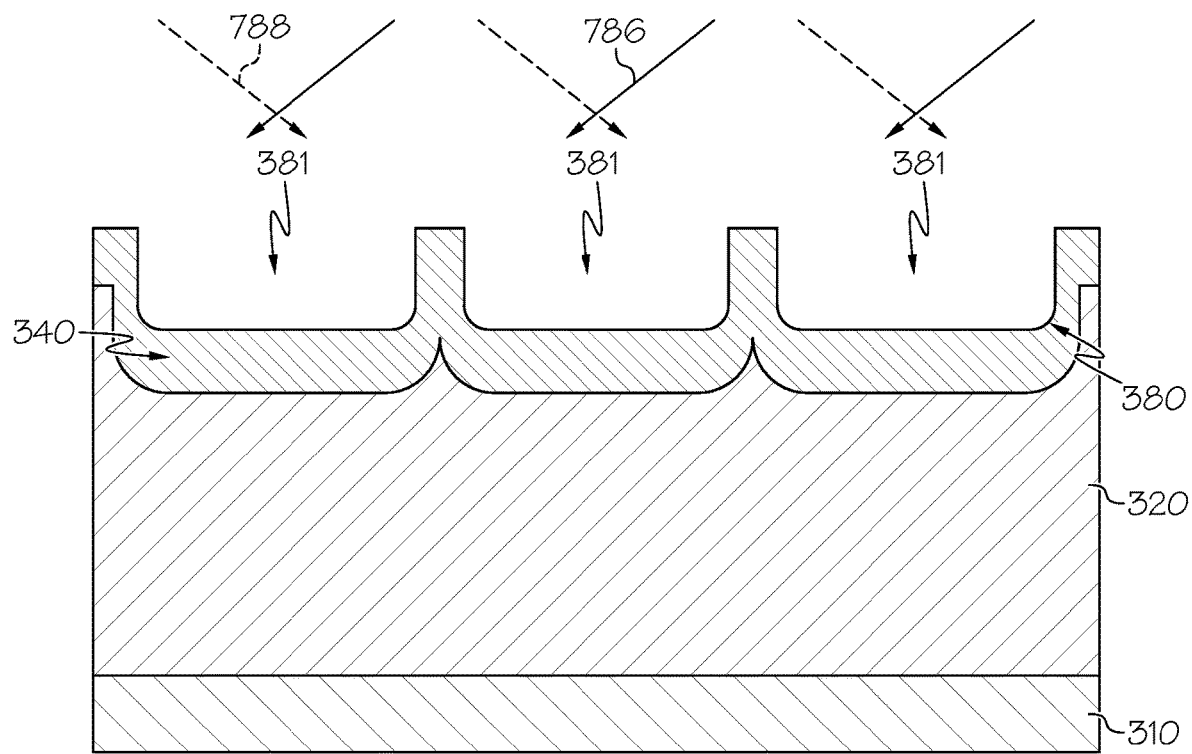

For example, as shown in FIG. 7C, to ensure that the implanted shielding patterns are connected in the intervening regions 383 (also referred to herein as the top connecting regions) between the trench segments 381, an angled ion implantation step may be performed to form the heavily-doped p-type deep shielding patterns 340 underneath the respective gate trench segments 381 and in the intervening regions 383. In particular, a first angled implant 786 may implant p-type dopant ions into a first sidewall and a bottom surface of the trench segments 381 along the longitudinal direction, and a second angled implant 788 may implant p-type dopant ions into a second sidewall and the bottom surface of the trench segments 381 along the longitudinal direction. The ion implantation 786, 788 may use symmetric opposite angled implants (e.g., in the range of ±5 to 45 degrees, ±10 to 30 degrees, or ±15 to 25 degrees, depending on trench segment spacing and depth), with half of the implant at each of the 2 angles). Since the dopant ions are implanted into ends of each gate trench segment 381 and into the intervening regions 383 therebetween along the longitudinal direction, the deep shielding patterns continuously extend in the longitudinal direction under and between the trench segments 381.

Figure 8C:
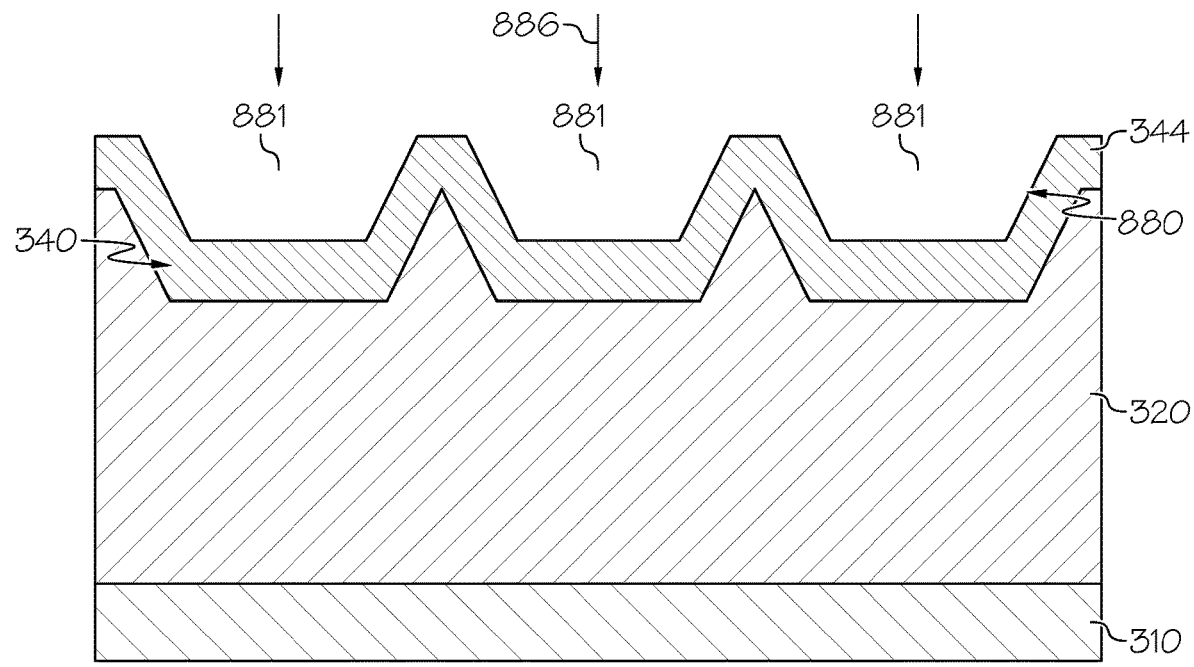

In further embodiments, vertical (rather than angled) ion implantation steps may be performed to form the above-described shielding patterns at block 920. For example, as shown in FIG. 8C, to ensure that the implanted shielding patterns 340 are connected in the intervening regions 883 between the trench segments 881, one or both of the ends of the trench segments 881 may be sloped or inclined, and a substantially vertical ion implantation process 886 (e.g., at an angle of less than about 2 degrees, less than about 1 degree, or less than about 0.5 degrees, relative to the surface of the structure 306) may be used to form the heavily-doped p-type deep shielding patterns 340 underneath the respective gate trench segments 881 and in the intervening regions 883. Due to the angle of incline (e.g., in the range of ±5 to 45 degrees depending on trench segment spacing and depth), one or both ends of the trench segments 881 may be implanted to form the shielding patterns 340 without using an angled ion implant. That is, to ensure that the implanted deep-P shielding patterns 340 continuously extend along the longitudinal direction of the segmented trenches 880 and into the intervening regions 883 between the segments with vertical ion implantation 886, the etch process at FIGS. 8A-8B may be controlled to angle the ends of the trench segments 881 (and thus, the periphery of the intervening regions 883 therebetween), so that the implant 886 can be normal to the surface of the semiconductor layer structure 306.

Figure 7D:
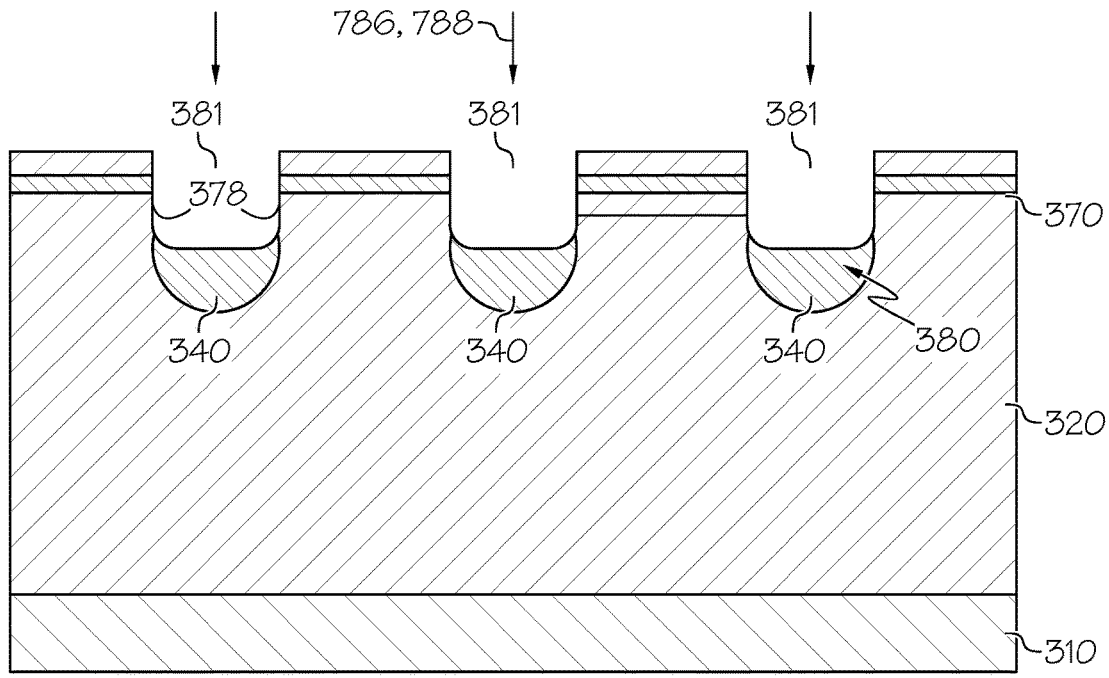
Figure 8D:
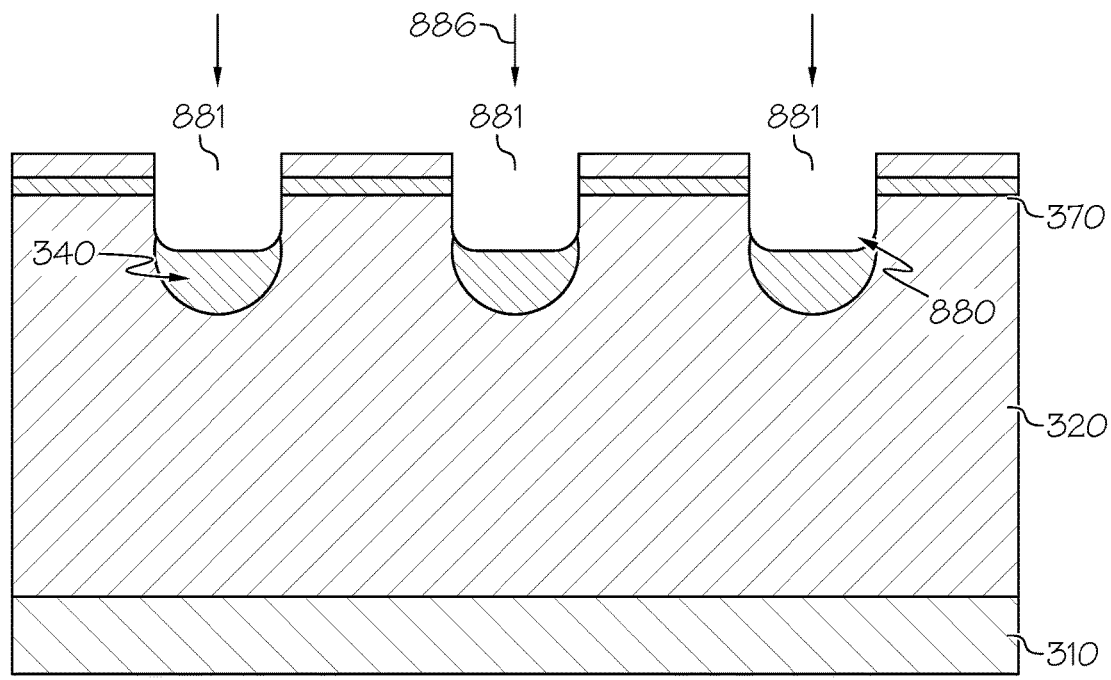

Referring to FIGS. 7D and 8D, the implantation process at block 920 is performed such that portions of the opposing sidewalls 378 of the trench segments 381 (i.e., portions above the deep-P shielding patterns 340 but below the p-well 370) are maintained as n-type to provide conduction, that is, such that both sidewalls 378 of the trench segments 381 provide portions of the channel region or conducting area of the devices 700, 800. To ensure that the portions of opposing sidewalls 378 of the trench segments 381 above the deep-P shielding patterns 340 but below the p-well 370 are not affected by the p-type implantation, the sidewalls 378 can be covered with a sacrificial mask layer (which can be etched away after the implantation), and/or the sidewalls 378 may be formed nearly vertical. In embodiments where the sidewalls are masked, some material of the sidewalls 378 can be etched away as needed after removing the mask. In embodiments where the verticality of the sidewalls 378 is relied upon to avoid implantation, the angled implants 786, 788 may be directional along the longitudinal direction, such that the implants 786, 788 are not angled along the direction perpendicular to the longitudinal direction. As such, portions of both opposing sidewalls 378 of each trench segment 381 are free of the shielding patterns 340.

In FIGS. 7C-7D and 8C-8D, the dopant ions are implanted into the bottom surface of each gate trench segment 381, 881, which may be about 0.5 to about 4 microns deep, about 1 to about 3.5 microns deep, or about 2 to about 3 microns deep, into the semiconductor layer structure 306. The implant conditions may be controlled such that the deep shielding patterns 340 can readily be implanted to a desired depth, and typically can be implanted using relatively low ion implantation energies. This may reduce damage to the lattice structure of semiconductor layer structure 306 and may provide a more precise and uniform doping concentration in the deep shielding patterns 340.

Referring again to FIG. 9, after forming the shielding patterns underneath the respective trench segments and in the intervening regions therebetween, respective shielding connection patterns having the second conductivity type are selectively formed in the intervening regions of the semiconductor layer structure between the trench segments at block 925. The shielding connection patterns may extend in a second direction, e.g., perpendicular to the longitudinal extension direction of the segmented trenches, either continuously (e.g., in embodiments where the trench segments of adjacent trenches are aligned, as shown in FIG. 3A) or discontinuously (e.g., in embodiments where the trench segments of adjacent trenches are offset, as show in FIG. 4A) along the upper portion of the semiconductor layer structure, allowing for electrical connections at the top of the device to the deep shielding patterns under the trench segments.

Figure 7E:
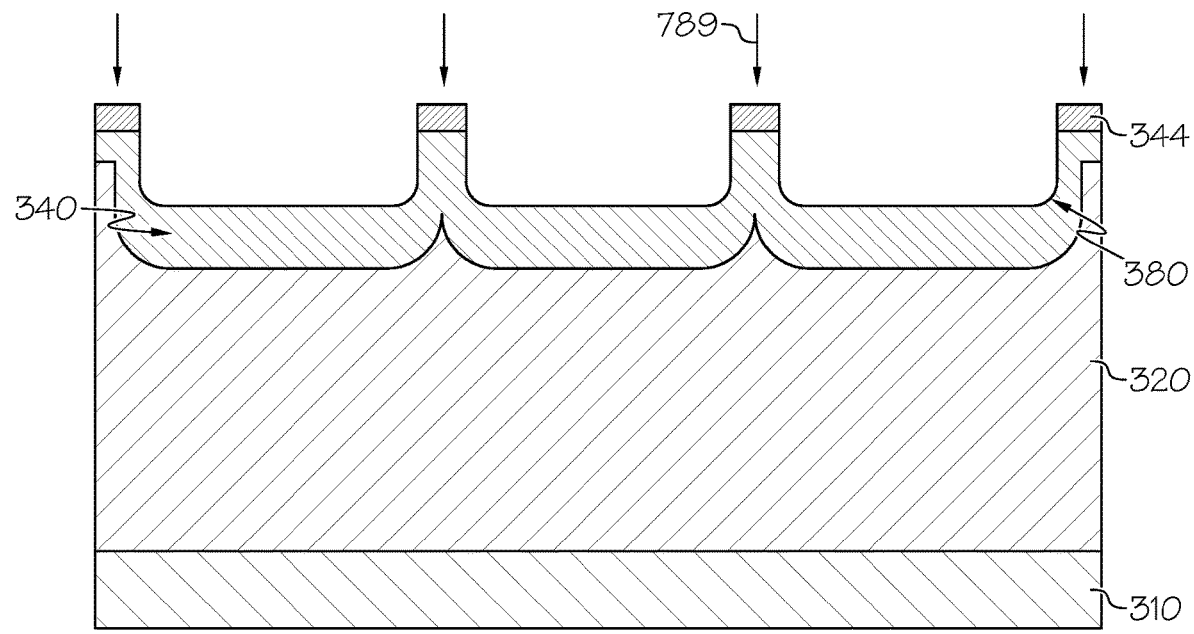
Figure 7F:
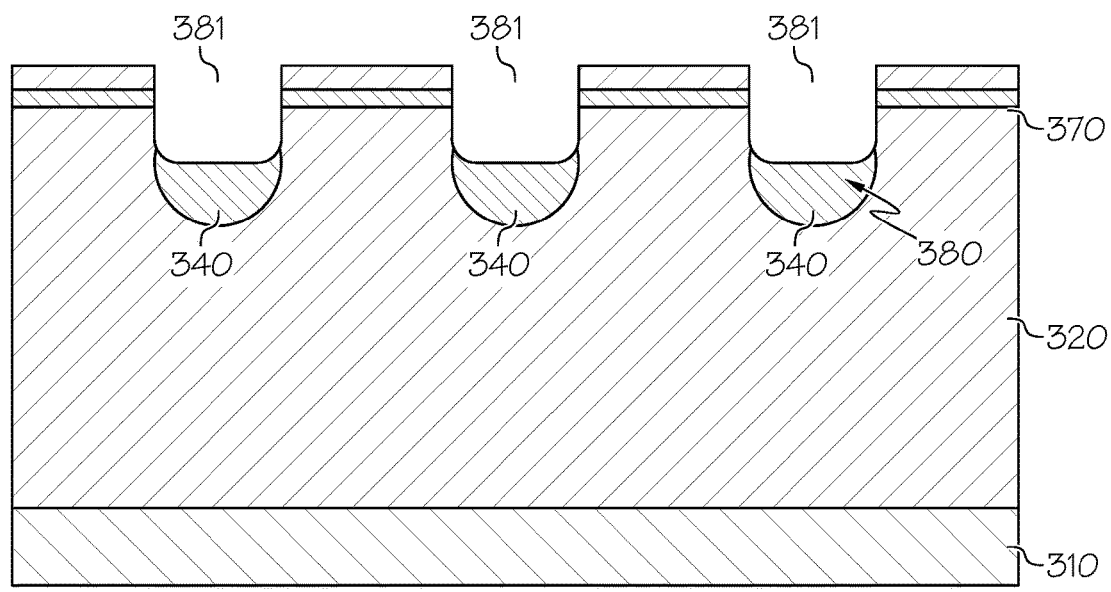
Figure 7G:
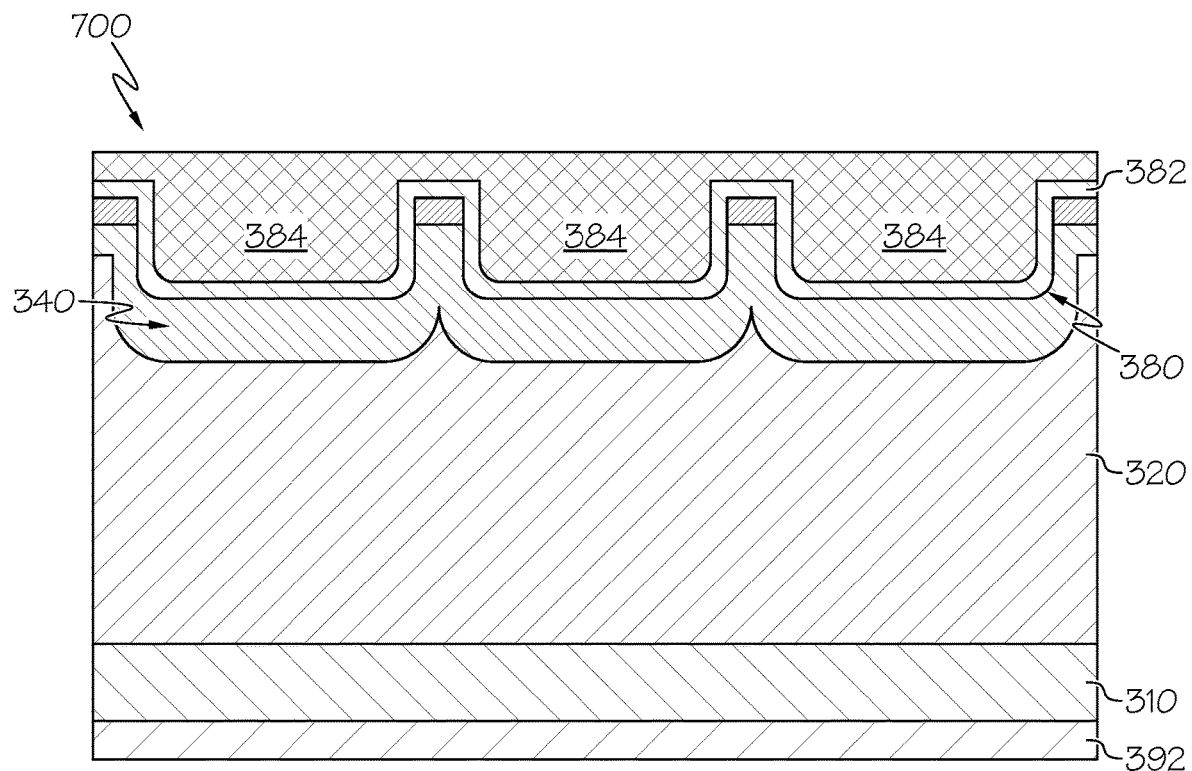
Figure 7H:
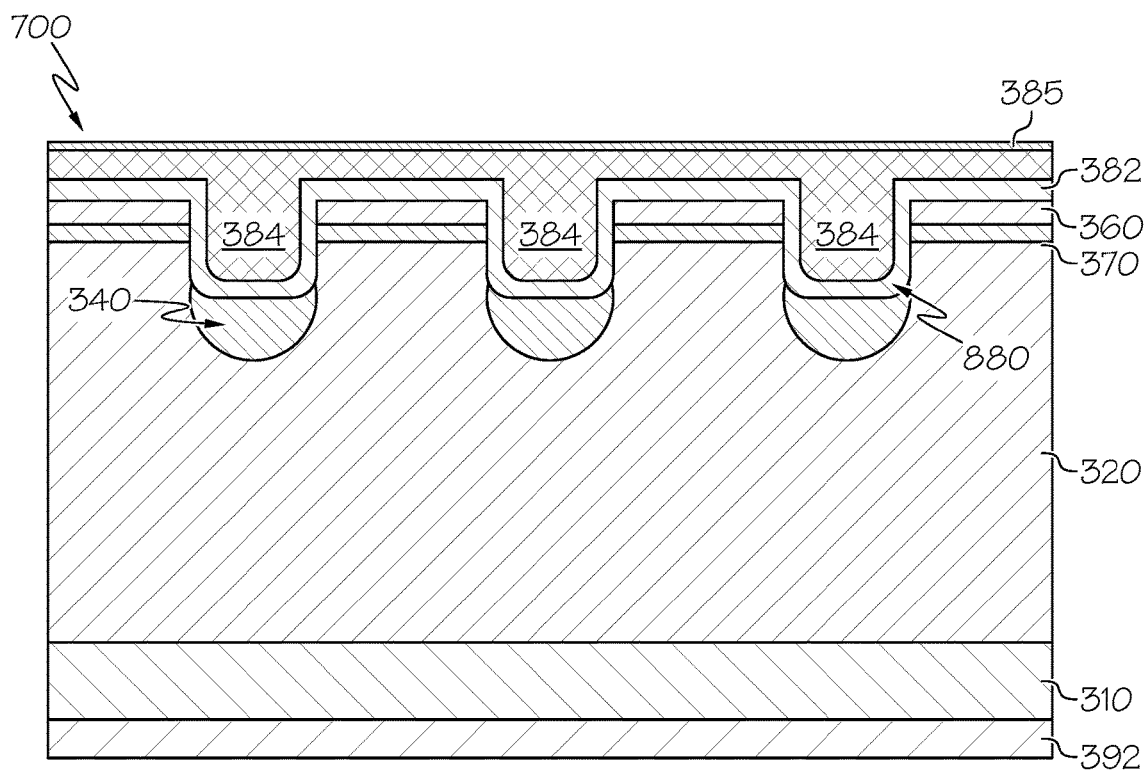
Figure 8E:
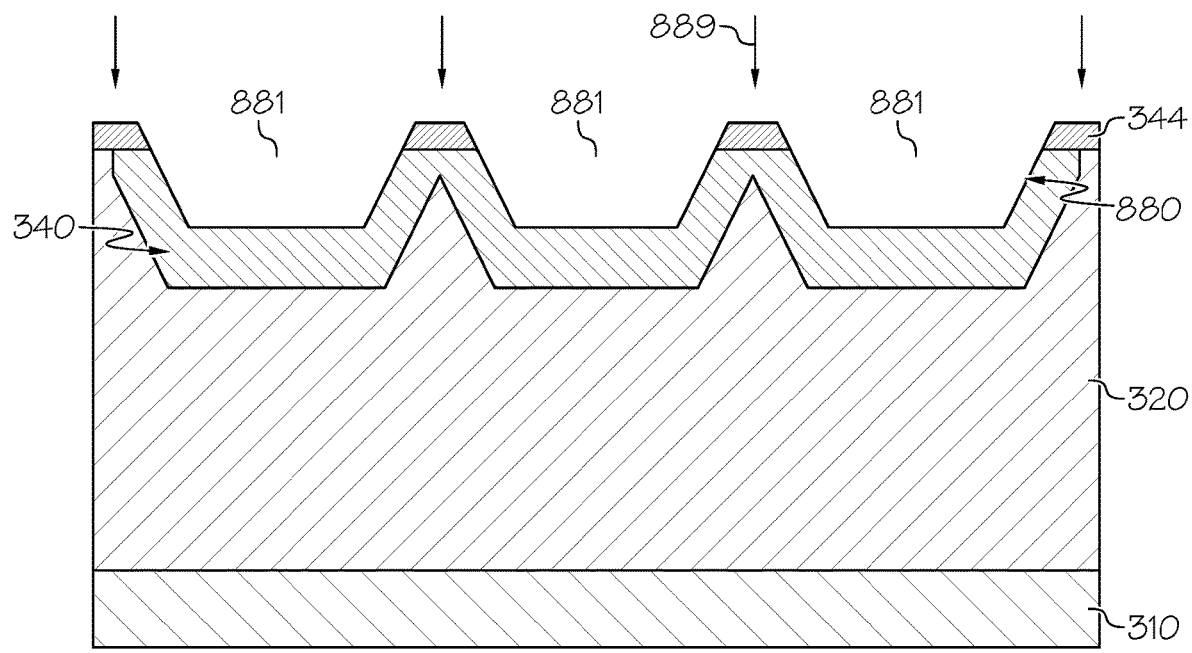
Figure 8F:
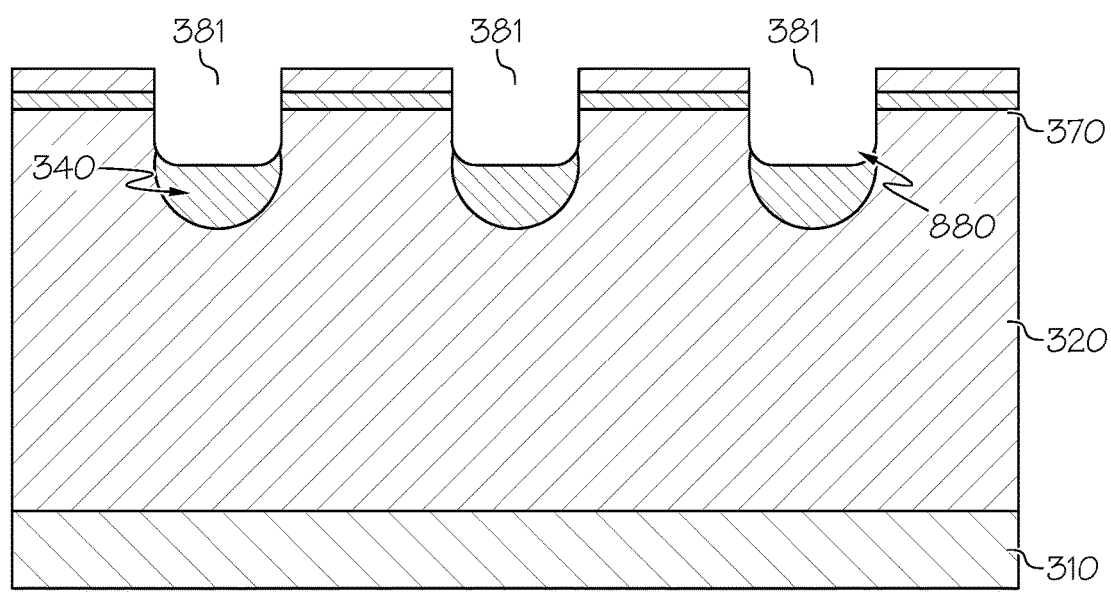
Figure 8G:
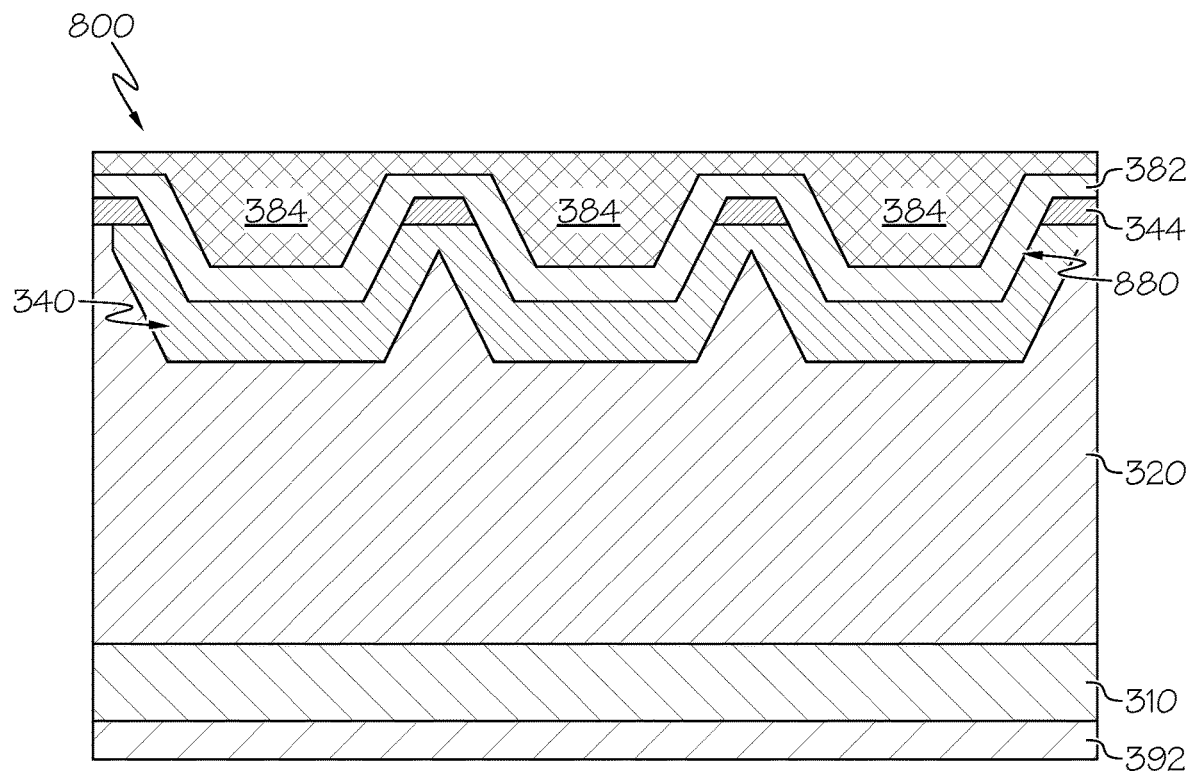
Figure 8H:
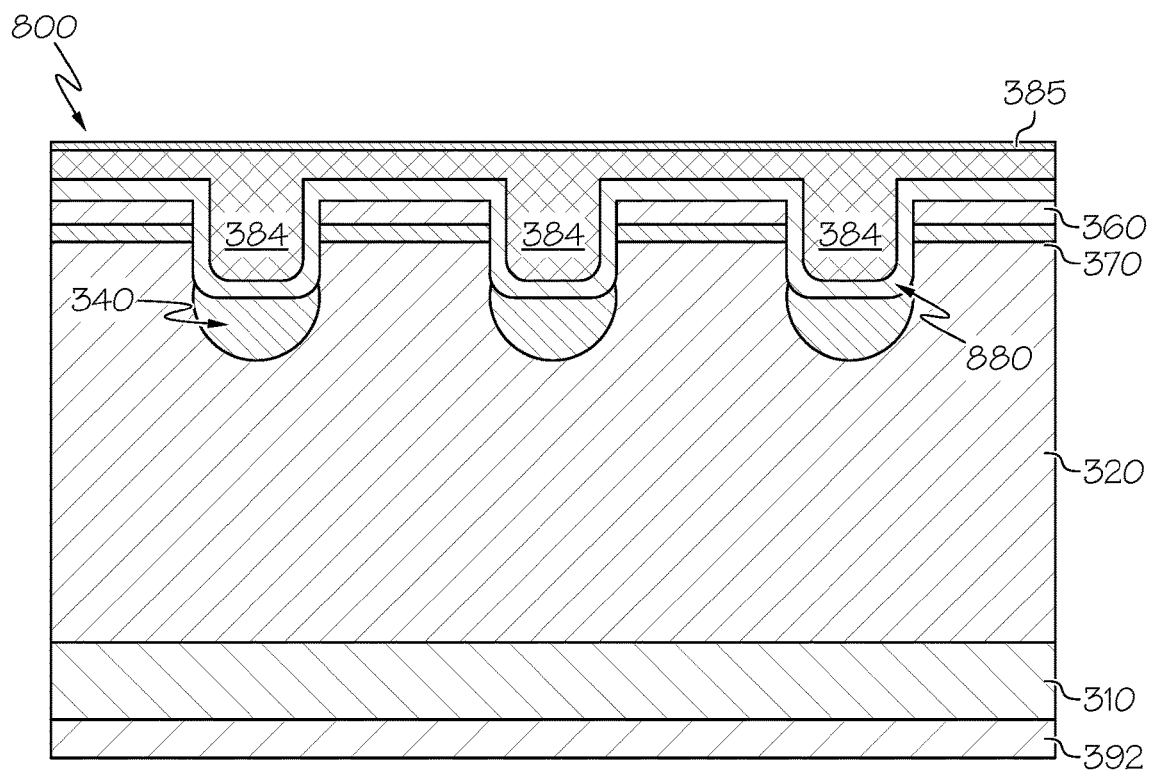

For example, heavily-doped (pc) p-type shielding connection patterns 344 may be formed using an ion implantation process 789, 889 to implant p-type dopant ions into the intervening regions 383, 883 at the upper portion of the semiconductor layer structure, as shown in FIGS. 7E and 8E. The implantation process 789, 889 may be selectively performed to confine the shielding connection patterns 344 to the intervening regions 383, 883 between trench segments 381, 881 and adjacent areas of the semiconductor layer structure between segmented trenches 380, 880. For example, one or more masking operations may be performed to selectively implant the p-type dopant ions into the intervening regions 383, 883, but not into the floors of the trench segments 381, 881, as shown in FIGS. 7F and 8F. The implantation process 789, 889 may be vertical or near vertical in some embodiments. In some embodiments, the shielding connection patterns 344 may be patterned, so as to be independent of the implantation angle. Also, the implantation process 789, 889 may be performed before the etching of the segmented trenches 380, 880, such that the shielding connection patterns 344 may be defined by the etch process. The shielding connection patterns 344 thus provide electrical connection to the shielding patterns 340 adjacent the upper surface or top of the device 700, 800. The shielding connection patterns 344 may also electrically connect the deep-p shielding regions 340 to the p-wells 370.

Referring to FIG. 9, gate insulating layers and gate electrodes may be formed in the segmented trenches at block 930. For example, as shown in FIGS. 7G-7H and 8G-8H, a gate insulating layer 382 such as a silicon oxide layer is formed on the bottom surface and sidewalls of each gate trench segment 381, 881. A gate electrode 384 is formed on each gate insulating layer 382. Each gate electrode 384 may fill the remainder of its respective gate trench segment 381, 881. The gate insulating layer 382 and gate 384 are illustrated as extending in areas outside of the trench segments 381, 881, but embodiments of the present disclosure are not limited thereto. Source regions having the first conductivity type may be formed on the well regions at block 940. For example, n-type source regions 360 may be formed on the p-wells 370 at the opposing sidewalls 378 of each trench segment 381, 881 by ion implantation into the upper portion of the semiconductor layer structure 306.

Contacts may be formed on the top and bottom surfaces of the semiconductor layer structure at block 950. For example, as shown in FIGS. 7G-7H and 8G-8H a drain contact 392 may be formed on the lower surface of the substrate 310. Gate electrode connectors 385 extending perpendicular to the longitudinal extension direction are formed as gate contacts on the gate electrodes 384. Source contacts 390 are formed at the upper portion of the semiconductor layer structure on the heavily-doped n-type source region 360 and on the heavily-doped p-type shielding connection patterns 344 in the intervening regions 383, 883. The source contacts 390 may provide electrical connection to the shielding patterns 340 through the respective shielding connection patterns 344. The source contacts 390 may be ohmic metal in some embodiments, and may provide a common source that is configured to electrically connect the shielding patterns 340 to an electrical ground. While the fabrication steps are set forth in one example order in the discussion above, it will be appreciated that the fabrication steps may be performed in a different order. For example, the order of the various etching and ion implantation steps may be changed from what is described above.

Pursuant to embodiments of the present disclosure, trenched wide band-gap power semiconductor devices, such as power MOSFETs or power IGBTs, are provided that have deep shielding semiconductor regions or patterns that extend underneath segmented gate trenches and extend to the upper surface of the semiconductor layer structure for contact or connection at the top of the device. In particular, the segmented gate trenches have include a plurality of spaced apart gate trench segments, with the shielding patterns extending under the gate trench segments and into intervening regions between the gate trench segments adjacent the top surface of the device. The shielding patterns may be formed along the longitudinal direction under and in opposing ends of each gate trench segment, but may not be formed on opposing sidewalls of the gate trench segments in the direction perpendicular to the longitudinal direction. As such, channel regions may be provided at both sidewalls of each gate trench segment, increasing the available conducting area at the trench sidewalls. Shielding connection patterns may be formed on the shielding patterns in the intervening regions between the gate trench segments to provide electrical contact thereto at the top of the device.

It will be appreciated that features of the different embodiments disclosed herein may be combined in any way to provide many additional embodiments. For example, features of any MOSFET embodiment described herein may be incorporated into IGBT embodiments fabricated on SiC, or other semiconductor materials such as Si. Thus, it will be appreciated that various features of the inventive concepts are described herein with respect to specific examples, but that these features may be added to other embodiments and/or used in place of example features of other embodiments to provide many additional embodiments. The present invention should therefore be understood to encompass these different combinations.

While the present invention is described above with respect to power MOSFET implementations, it will be appreciated that the techniques described herein apply equally well to other similar vertical power semiconductor devices having a gate trench. Thus, embodiments of the present invention are not limited MOSFETs, and the techniques disclosed herein may be used on IGBTs or any other appropriate gate trench device.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
a semiconductor layer structure comprising a wide bandgap semiconductor material, the semiconductor layer structure including a drift region having a first conductivity type and a well region having a second conductivity type; and
a plurality of segmented gate trenches extending longitudinally in a first direction in the semiconductor layer structure, the segmented gate trenches comprising respective gate trench segments that are spaced apart from each other in the first direction with intervening regions of the semiconductor layer structure therebetween and spaced apart in the first direction.

2. The semiconductor device of claim 1, further comprising:
a plurality of shielding patterns having the second conductivity type extending in the first direction underneath the respective gate trench segments and in the intervening regions therebetween.

3. The semiconductor device of claim 2, further comprising:
respective shielding connection patterns having the second conductivity type on the shielding patterns in the intervening regions between the respective gate trench segments in the first direction, the respective shielding connection patterns extending in a second direction that is different than the first direction.

4. The semiconductor device of claim 3, wherein the respective shielding connection patterns are in an upper portion of the semiconductor layer structure, and further comprising:
respective source contacts on the respective shielding connection patterns, wherein the respective shielding connection patterns electrically connect the respective source contacts to the shielding patterns.

5. The semiconductor device of claim 3, wherein the respective gate trench segments of at least two of the segmented gate trenches are aligned along the second direction, and wherein the respective shielding connection patterns continuously extend in the second direction.

6. The semiconductor device of claim 3, wherein the respective gate trench segments of at least two of the segmented gate trenches are offset along the second direction, and wherein the respective shielding connection patterns discontinuously extend in the second direction.

7. The semiconductor device of claim 2, wherein the respective gate trench segments comprise opposing sidewalls that extend in the first direction, the opposing sidewalls defining respective semiconductor channel regions having the first conductivity type.

8. The semiconductor device of claim 7, wherein respective portions of both of the opposing sidewalls are free of the shielding patterns thereon.

9. The semiconductor device of claim 3, wherein the respective gate trench segments include respective gate electrodes therein, and further comprising:
respective gate electrode connectors on the respective gate electrodes and extending in the second direction between the respective shielding connection patterns.

10. A semiconductor device, comprising:
a semiconductor layer structure comprising a wide bandgap semiconductor material, the semiconductor layer structure including a drift region having a first conductivity type and a well region having a second conductivity type;
a plurality of gate trenches extending longitudinally in a first direction in the semiconductor layer structure, the gate trenches respectively comprising opposing sidewalls and a floor therebetween that extend in the first direction, wherein the floor is non-planar along the first direction; and
a plurality of shielding patterns having the second conductivity type extending in the first direction underneath and along the non-planar floor of the gate trenches.

11. The semiconductor device of claim 10, wherein respective portions of both of the opposing sidewalls are free of the shielding patterns thereon and define respective semiconductor channel regions having the first conductivity type.

12. The semiconductor device of claim 10, wherein the gate trenches are segmented gate trenches comprising respective gate trench segments that are spaced apart from each other in the first direction with intervening regions of the semiconductor layer structure therebetween in the first direction, and wherein the shielding patterns extend into the intervening regions.

13. The semiconductor device of claim 12, further comprising:
respective shielding connection patterns having the second conductivity type on the shielding patterns in the intervening regions between the respective gate trench segments in the first direction, the respective shielding connection patterns extending in a second direction that is different than the first direction.

14. The semiconductor device of claim 13, wherein the respective shielding connection patterns are in an upper portion of the semiconductor layer structure, and further comprising:
respective source contacts on the respective shielding connection patterns in the upper portion of the semiconductor layer structure, wherein the respective shielding connection patterns electrically connect the respective source contacts to the shielding patterns; and
a drain contact on a lower portion of the semiconductor layer structure opposite the upper portion.

15. The semiconductor device of claim 10, wherein the gate trenches that respectively comprise the opposing sidewalls are immediately adjacent one another.

16. A semiconductor device, comprising:
a semiconductor layer structure comprising a wide bandgap semiconductor material, the semiconductor layer structure including a drift region having a first conductivity type and a well region having a second conductivity type; and
a plurality of gate trenches extending longitudinally in a first direction in the semiconductor layer structure, the gate trenches respectively comprising opposing sidewalls and a floor therebetween that extend in the first direction, wherein the floor is non-planar along the first direction and
wherein the opposing sidewalls comprise respective sidewall areas, wherein a sum of the respective sidewall areas define a total sidewall area of the opposing sidewalls of the plurality of gate trenches, and wherein greater than half of the total sidewall area is configured to conduct current.

17. The semiconductor device of claim 16, further comprising:
a plurality of shielding patterns having the second conductivity type extending in the first direction underneath and along the non-planar floor of the gate trenches and to electrically contact the well region,
wherein the gate trenches that respectively comprise the opposing sidewalls are immediately adjacent one another.

18. The semiconductor device of claim 17, wherein the gate trenches are segmented gate trenches comprising respective gate trench segments that are spaced apart from each other in the first direction with intervening regions of the semiconductor layer structure therebetween in the first direction, and wherein the shielding patterns extend into the intervening regions.

19. The semiconductor device of claim 18, wherein respective portions of both of the opposing sidewalls are free of the shielding patterns thereon.

20. The semiconductor device of claim 18, further comprising:
respective shielding connection patterns having the second conductivity type on the shielding patterns in the intervening regions between the respective gate trench segments in the first direction, the respective shielding connection patterns electrically connecting the shielding patterns to a well region and extending in a second direction that is different than the first direction.

21. The semiconductor device of claim 20, wherein the respective shielding connection patterns are in an upper portion of the semiconductor layer structure, and further comprising:
respective source contacts on the respective shielding connection patterns in the upper portion of the semiconductor layer structure, wherein the respective shielding connection patterns electrically connect the respective source contacts to the shielding patterns; and
a drain contact on a lower portion of the semiconductor layer structure opposite the upper portion.

22. A method of fabricating a semiconductor device, the method comprising:
providing a semiconductor layer structure comprising a wide band-gap semiconductor material, the semiconductor layer structure including a drift region having a first conductivity type and a well region having a second conductivity type; and
forming a plurality of segmented gate trenches extending longitudinally in a first direction in the semiconductor layer structure, the segmented gate trenches comprising respective gate trench segments that are spaced apart from each other in the first direction with intervening regions of the semiconductor layer structure therebetween and spaced apart in the first direction.

23. The method of claim 22, further comprising:
forming a plurality of shielding patterns having the second conductivity type extending in the first direction underneath the respective gate trench segments and in the intervening regions therebetween.

24. The method of claim 23, further comprising:
forming respective shielding connection patterns having the second conductivity type on the shielding patterns in the intervening regions between the respective gate trench segments in the first direction, the respective shielding connection patterns extending in a second direction that is different than the first direction.

25. The method of claim 24, wherein the respective gate trench segments comprise opposing sidewalls defining respective semiconductor channel regions having the first conductivity type, and wherein the plurality of shielding patterns are formed such that respective portions of both of the opposing sidewalls are free of the shielding patterns thereon.

26. The method of claim 25, wherein forming the plurality of shielding patterns and the respective shielding connection patterns comprises:
performing a first implantation process to implant a first concentration of dopants of the second conductivity type into the respective gate trench segments and in the intervening regions therebetween to form the plurality of shielding patterns; and
performing a second implantation process to implant a second concentration of dopants of the second conductivity type into the intervening regions between the respective gate trench segments at an upper portion of the semiconductor layer structure to form the respective shielding connection patterns.

27. The method of claim 24, further comprising:
forming respective source contacts on portions of the respective shielding connection patterns between the segmented gate trenches, wherein the respective shielding connection patterns electrically connect the respective source contacts to the shielding patterns.

* * * * *

UNITED STATES PATENT AND TRADEMARK OFFICE
CERTIFICATE OF CORRECTION

| | |
|---|---|
| PATENT NO. | : 11,563,080 B2 |
| APPLICATION NO. | : 16/863399 |
| DATED | : January 24, 2023 |
| INVENTOR(S) | : Daniel Jenner Lichtenwalner |

It is certified that error appears in the above-identified patent and that said Letters Patent is hereby corrected as shown below:

In the Specification

Column 6, Line 62: Please correct "+15%" to read --±15%--

Column 7, Line 34: Please correct "(pc)" to read --(p+)--

Column 10, Line 52: Please correct "(pc)" to read --(p+)--

Column 14, Line 6: Please correct "(pc)" to read --(p+)--

Column 19, Line 61: Please correct "(pc)" to read --(p+)--

Signed and Sealed this
Ninth Day of May, 2023

*Katherine Kelly Vidal*

Katherine Kelly Vidal
*Director of the United States Patent and Trademark Office*